United States Patent
Kishi et al.

(10) Patent No.: US 6,605,836 B2
(45) Date of Patent: Aug. 12, 2003

(54) MAGNETORESISTANCE EFFECT DEVICE, MAGNETIC MEMORY APPARATUS, PERSONAL DIGITAL ASSISTANCE, AND MAGNETIC REPRODUCING HEAD, AND MAGNETIC INFORMATION

(75) Inventors: Tatsuya Kishi, Kanagawa-ken (JP); Shigeki Takahashi, Kanagawa-ken (JP); Kentaro Nakajima, Tokyo (JP); Minoru Amano, Kanagawa-ken (JP); Masayuki Sagoi, Kanagawa-ken (JP); Yoshiaki Saito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/097,571

(22) Filed: Mar. 15, 2002

(65) Prior Publication Data

US 2002/0130339 A1 Sep. 19, 2002

(30) Foreign Application Priority Data

Mar. 16, 2001 (JP) ........................ 2001-076614

(51) Int. Cl.$^7$ ........................... H01L 31/119; B32B 7/02
(52) U.S. Cl. ................ 257/295; 428/212; 365/171; 365/173; 365/158; 324/252
(58) Field of Search .................. 257/295; 365/158, 365/171, 173; 324/252; 428/332, 212, 336, 692, 694, 900

(56) References Cited

U.S. PATENT DOCUMENTS 5,652,445 A * 7/1997 Johnson ................ 257/295
5,757,695 A     5/1998 Shi et al.
5,953,248 A     9/1999 Chen et al.
5,978,182 A * 11/1999 Kanai et al. ............. 360/324.1
6,104,633 A     8/2000 Abraham et al.

OTHER PUBLICATIONS

U.S. patent application Ser. No. 09/662,117, Inomata et al., filed Sep. 14, 2000.

U.S. patent application Ser. No. 09/735,629, Nakajima et al., filed Dec. 14, 2000.

* cited by examiner

Primary Examiner—David Nelms
Assistant Examiner—Long Tran
(74) Attorney, Agent, or Firm—Oblon, Spivak, McClelland, Maier & Neustadt, P.C.

(57) ABSTRACT

Magnetoresistance effect devices for attaining magnetically stability and for reducing a switching magnetic field. One of the ferromagnetic layers of the magnetoresistance effect device has a plane shape in which a width of an end portions is wider than a center portion sandwiched by two end portions. The end portions are not symmetrical with respect to an easy magnetization axis or longer axis of the plane shape of ferromagnetic material layer, but are substantially rotationally symmetrical with a center of the plane shape as a pivot. The plane shape may have an S-shape where its magnetic domain is stabilized and the switching magnetic field is reduced. The magnetoresistance effect devices may be used in a magnetic memory apparatus, such as a random access memory, a personal digital assistance, a magnetic reproducing head, and a magnetic information reproducing apparatus.

17 Claims, 26 Drawing Sheets

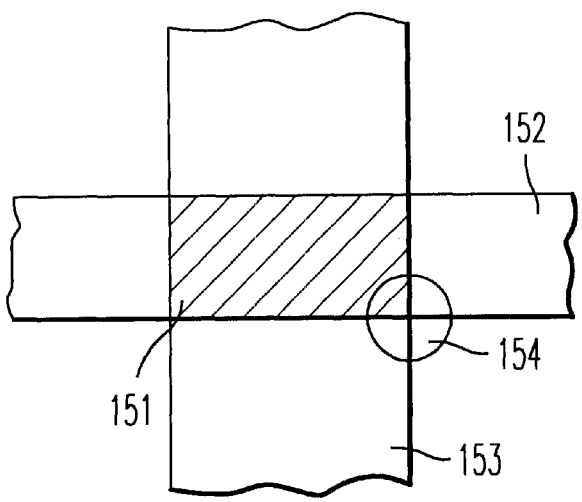
*FIG. 14*
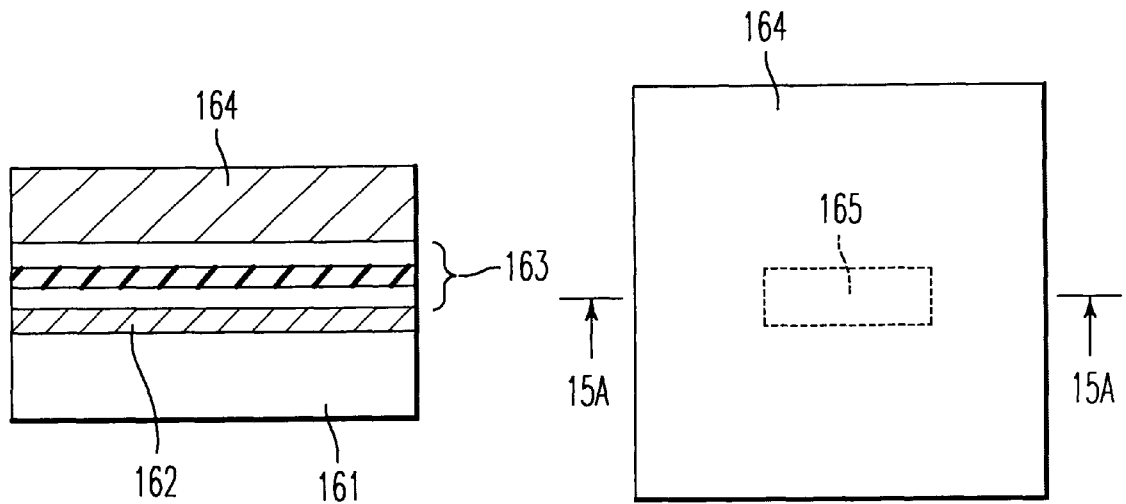
*FIG. 15A*        *FIG. 15B*

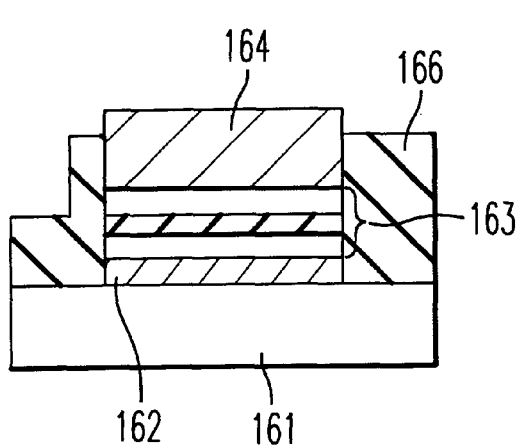
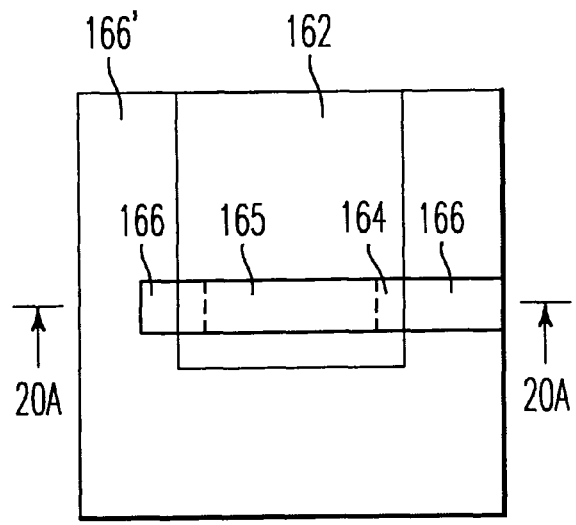
FIG.20A  FIG.20B
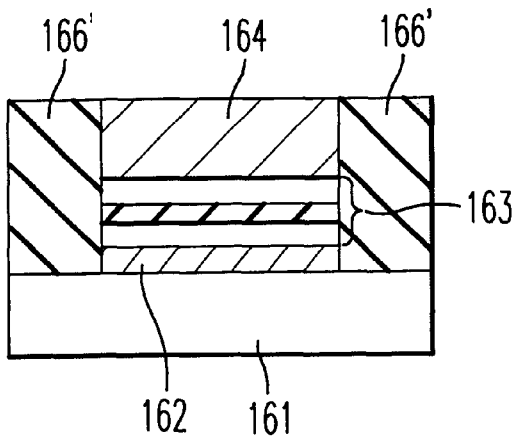
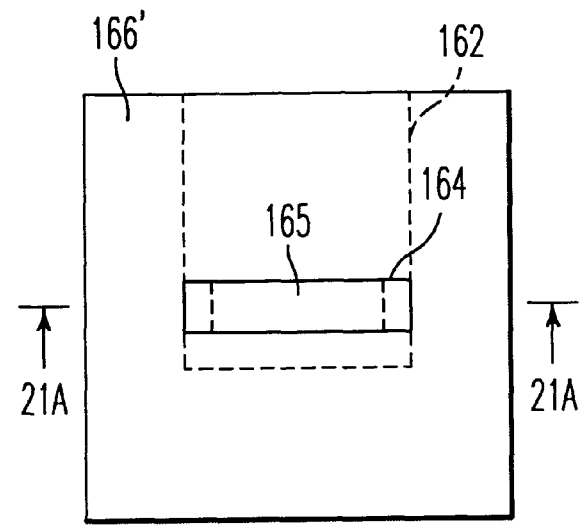
FIG.21A  FIG.21B

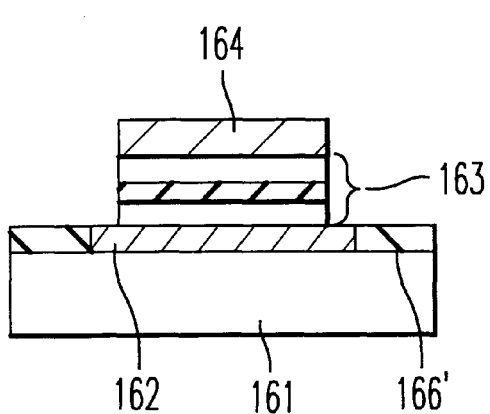
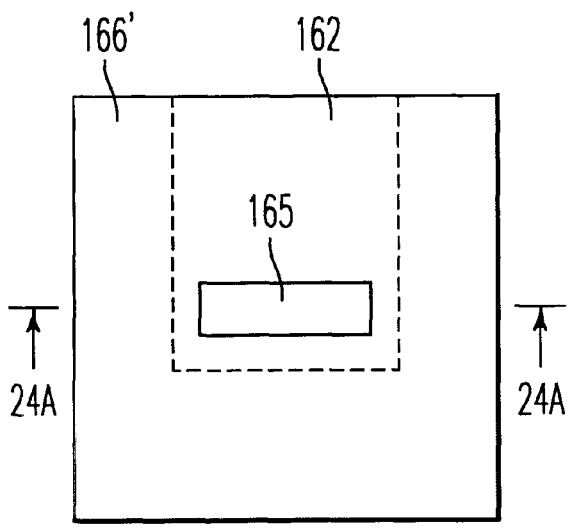
*FIG.24A*     *FIG.24B*
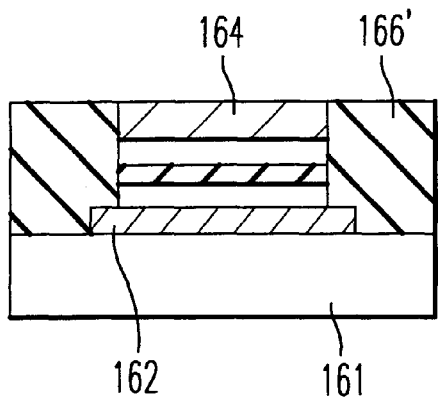
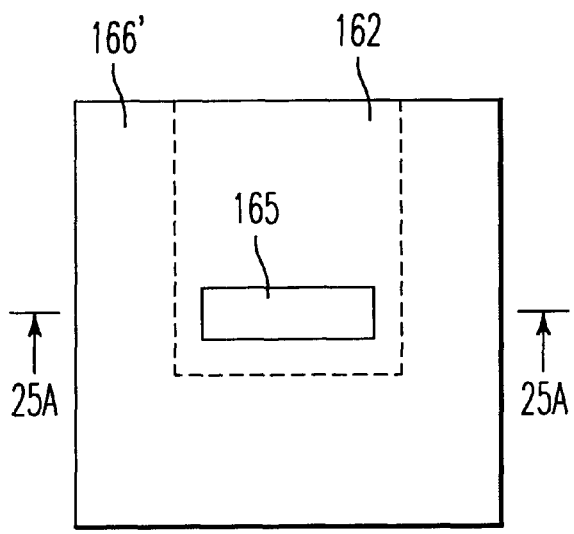
*FIG.25A*     *FIG.25B*

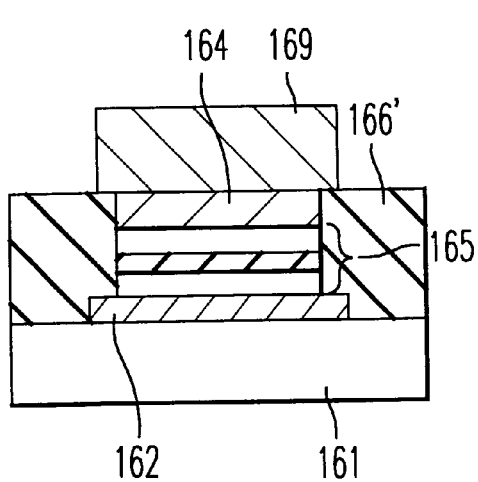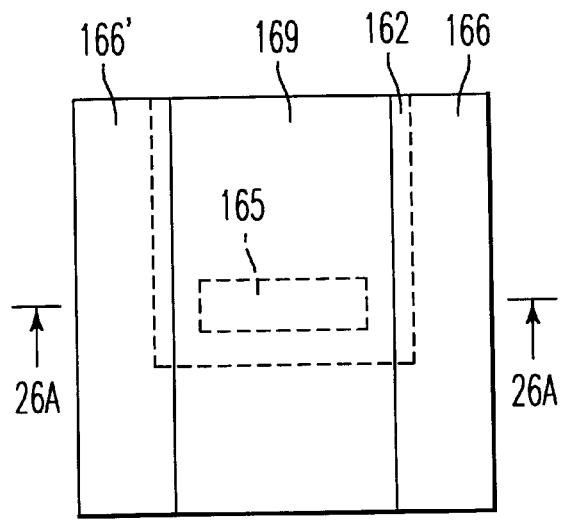
FIG.26A  FIG.26B
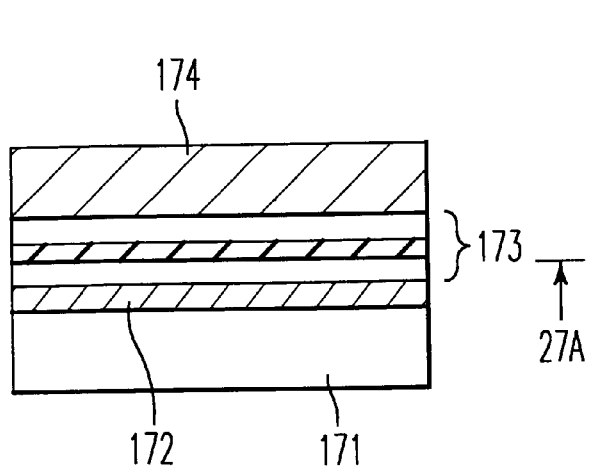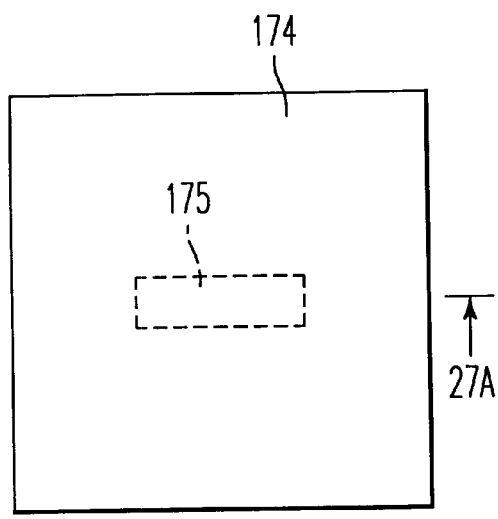
FIG.27A  FIG.27B

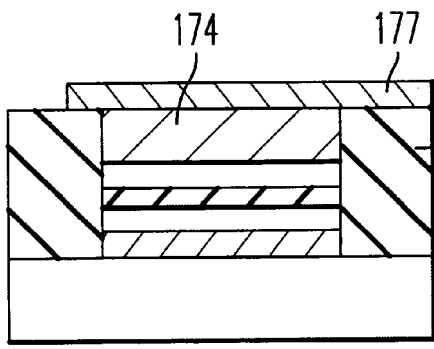
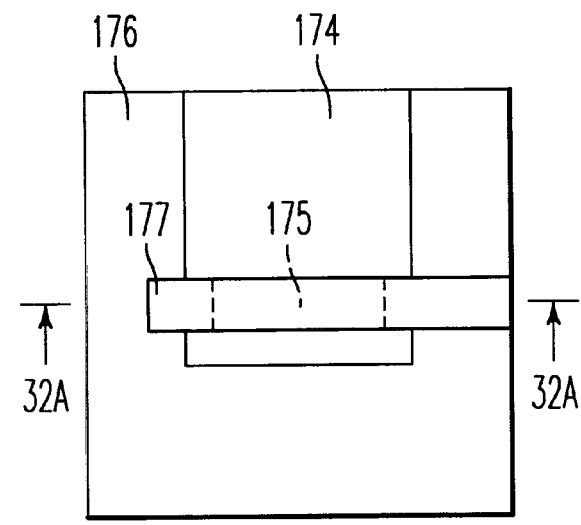
FIG. 32A          FIG. 32B
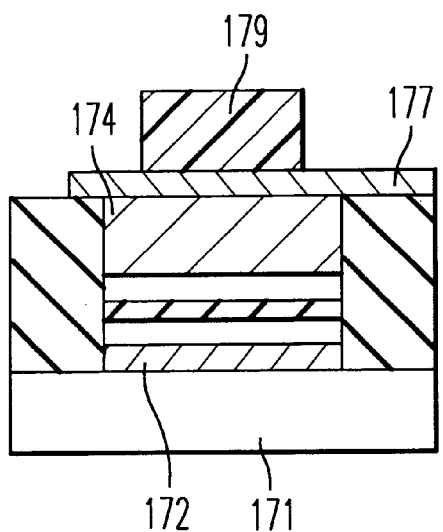
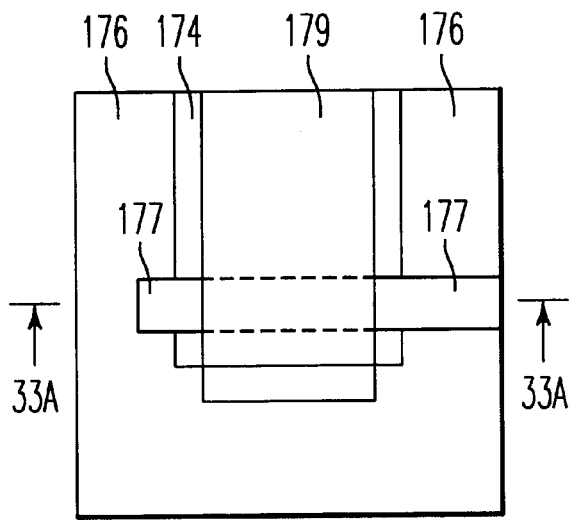
FIG. 33A          FIG. 33B

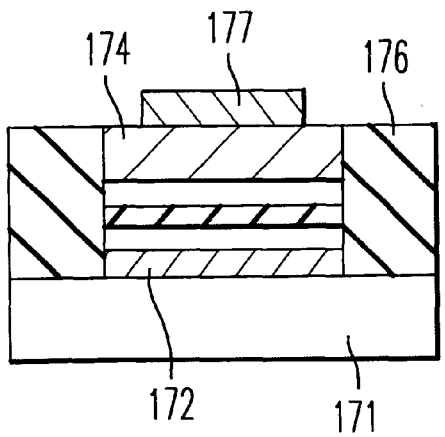
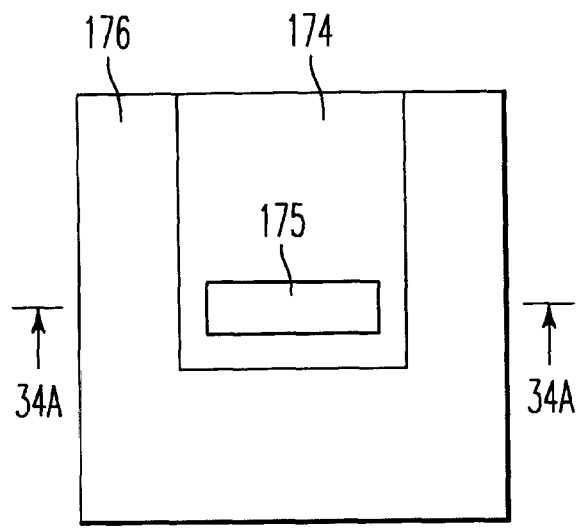
FIG. 34A          FIG. 34B
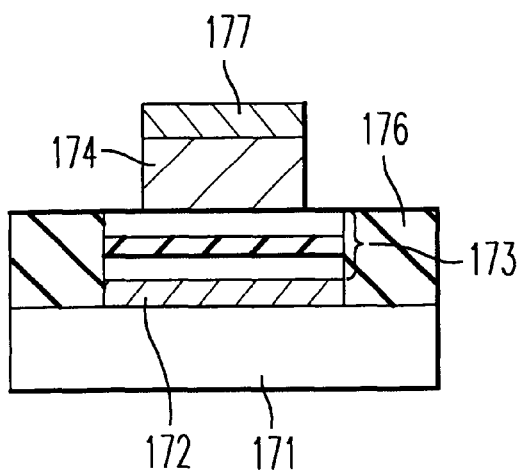
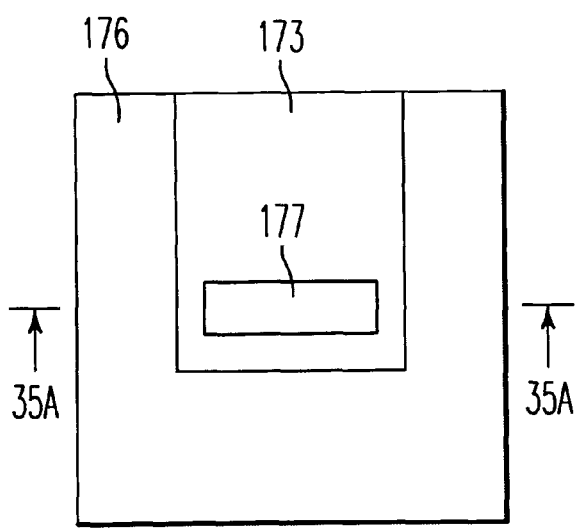
FIG. 35A          FIG. 35B

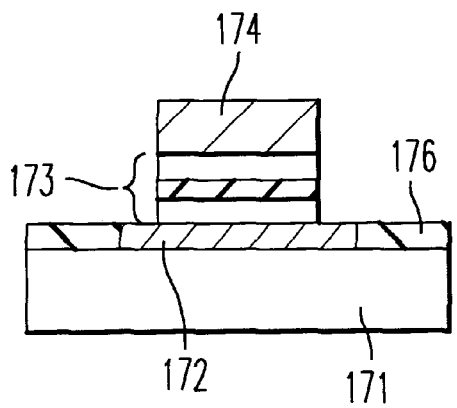
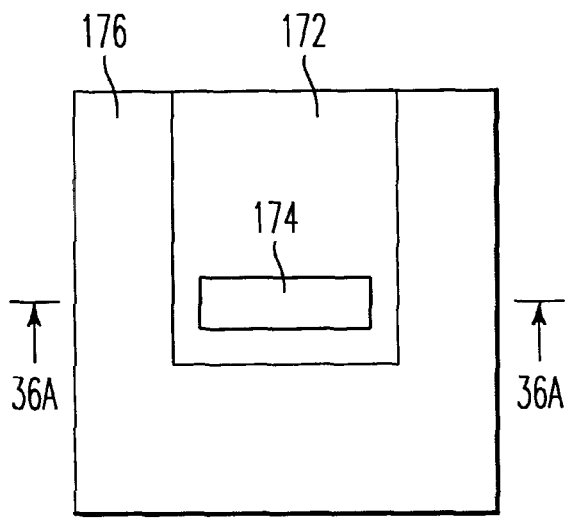
*FIG. 36A*  *FIG. 36B*
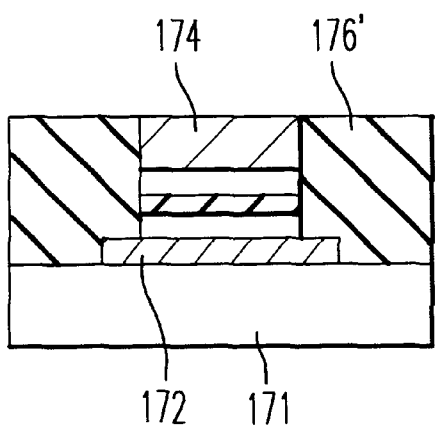
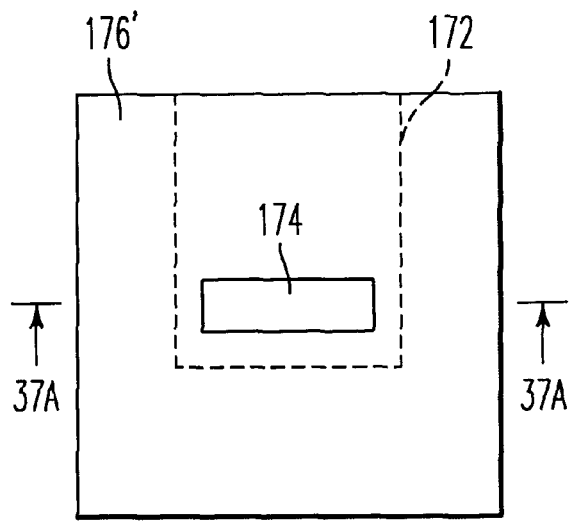
*FIG. 37A*  *FIG. 37B*

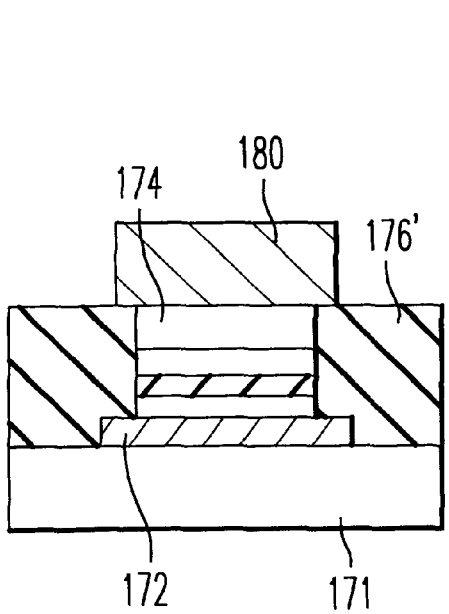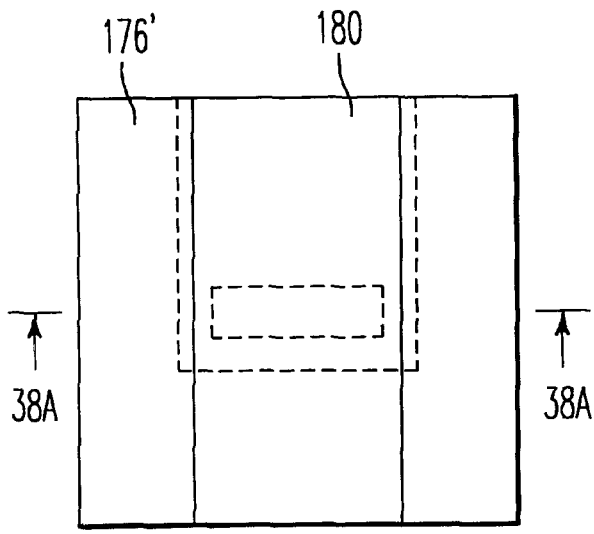
*FIG.38A*  *FIG.38B*
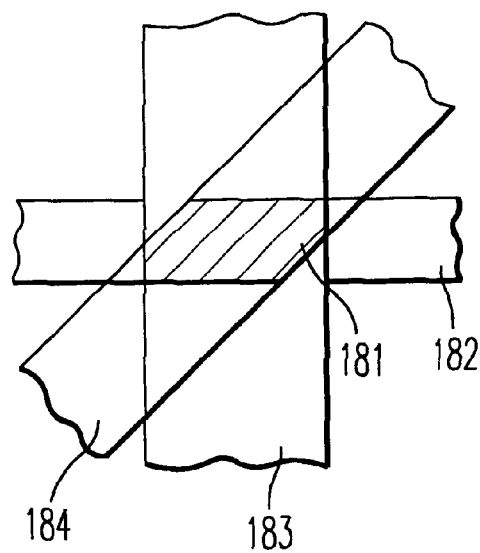
*FIG.39*

MAGNETORESISTANCE EFFECT DEVICE, MAGNETIC MEMORY APPARATUS, PERSONAL DIGITAL ASSISTANCE, AND MAGNETIC REPRODUCING HEAD, AND MAGNETIC INFORMATION

CROSS REFERENCE TO A RELATED APPLICATION

This application claims the benefit of priority from Japanese Patent Application No. 2001-076614, filed on Mar. 16, 2001, the entire contents of which are incorporated herein by reference.

BACKGROUND OF THE INVENTION

1. Field of the invention

The present invention relates to a magnetoresistance effect device, a method of manufacturing the same, a magnetic memory apparatus, a personal digital assistance, a magnetic reproducing head and a magnetic information reproducing apparatus.

2. Discussion of the Background

Solid magnetic memories including a Magnetic Random Access Memory (MRAM) using a MagnetoResistance (MR) effect element have been proposed. Further, a Tunnel MagnetoResistance effect device (TMR device) that uses a ferromagnetic tunnel junction has recently drawn attention as a component of a memory cell of the MRAM.

A conventional ferromagnetic tunnel junction has a three-layered film including a first ferromagnetic metal layer, a nonmagnetic dielectric layer and a second ferromagnetic metal layer. A current for sensing the tunnel junction's resistance flows from the first to the second of the ferromagnetic material layers via the nonmagnetic dielectric layer. The nonmagnetic dielectric layer forms a tunnel junction of the device, sometimes referred to as a tunnel dielectric layer. Each of the two ferromagnetic layers has a magnetization direction and a resistance value of the tunnel junction that changes in proportion to a cosine of a relative angle of magnetization directions of the first and second ferromagnetic layers.

The resistance value is at a minimum value when two magnetization directions of the ferromagnetic layers are parallel to each other and is a maximum value when the magnetization directions are not parallel to each other. A change in a resistance value (resistance amplitude) of the TMR device as much as 49.7% at room temperature (Appl. Phys. Lett. 77,283 (2000)) has been reported.

The magnetization of one of the ferromagnetic layers of the ferromagnetic tunnel junction is fixed or pinned so the magnetization does not change or is inverted in an applied magnetic field, whereby the fixed magnetization ferromagnetic layer is used as a reference layer. The magnetization of the other ferromagnetic material layer is set to be free to rotate in the specific magnetic field, whereby the free magnetization ferromagnetic layer is used as a memory layer.

Several methods for fixing the magnetization of the reference layer and for allowing the magnetization free to rotate in the memory layer are disclosed in U.S. Pat. No. 5,159,513, the entire content of which is incorporated by reference.

In addition, the magnetization direction of the memory layer is changed in an applied magnetic field and the memory layer retains the changed magnetization direction.

Further, the magnetization direction of the reference layer does not change in the applied magnetic field. Thus, the relative angle (i.e., parallel or antiparallel) of the magnetizations between the reference layer and the memory layer is changed. A binary value of "0" or "1" can be denoted to correspond to each of the parallel or antiparallel states.

Further, the magnetic information is written or recorded by inverting or changing the magnetization of the memory layer by the applied magnetic field. This is accomplished by generating a current to flow through a write line, which is electrically separate from but near the memory cell. The written or recorded information is read or reproduced by detecting a tunnel resistance change from a sense current flowing through the ferromagnetic tunnel junction. Further, a magnetic memory apparatus includes a number of the memory cells usually aligned in column and row directions on a same base, such as a semiconductor substrate.

A switching transistor may also be arranged with each memory cell and be coupled to the TMR device, similar to the Dynamic Random Access Memory (DRAM). Thus, an integrated peripheral circuit may select an arbitrary memory cell of the memory array. In addition, a diode can be used instead of the switching transistor and be placed at an intersection of a word line and a bit line (see U.S. Pat. Nos. 5,640,343 and 5,650,958, for example), where either the word line or the bit line is coupled to the TMR device via the diode, and the other of the word line or the bit line is directly coupled to the TMR device.

To form a highly integrated memory apparatus, a size of the memory cell including the TMR device should be reduced. However, as the size of ferromagnetic layer of the TMR device is reduced, a coercive force of the reduced ferromagnetic material layer becomes larger. A magnitude of a coercive force corresponds and is proportional to a magnitude of a switching magnetic field necessary for inverting a magnetization of the ferromagnetic memory layer. Therefore, an increase of the coercive force signifies an increase in the writing current, resulting in an increase in power consumption. An important subject to solve is to build the highly integrated magnetic memory apparatus with a reduction in coercive force of each ferromagnetic memory layer.

The TMR device usually has a rectangular plane shape, however, it is known that magnetic edge domains are produced in a small rectangular shape ferromagnetic layer (J. App. Phys. 81,5471 (1997)). The magnetic edge domain is formed, because magnetization at two shorter sides of the rectangular shape forms a pattern spirally rotated in line with the side to reduce a demagnetizing field energy.

For example, FIG. 1A is a plan view of an example of such a magnetic structure. As shown, the magnetic structure is an S-shaped magnetic domain structure, in which a magnetization at a center 11 is produced in a direction parallel to a magnetic anisotropy. Further, edge magnetic domains at both end portions 12 and 13 are produced and have a magnetization in a direction different from the center 11. FIG. 1B is a plan view of a C-shaped magnetic domain structure, in which the center 11 and both end portions 14 and 15 have different magnetization directions and in which the magnetizations of the end portions 14 and 15 are antiparallel to each other.

When the magnetization of the rectangular-shaped ferromagnetic memory layer starts to change or invert, each of the edge domains areas spreads. When the edge domains have magnetization directions antiparallel to each other as shown in FIG. 1B, a domain wall surrounds the center of the ferromagnetic material memory layer, whereby the coercive force of the memory layer is increased.

In addition, a ferromagnetic memory layer having an elliptic shape for reducing the edge domains is disclosed in U.S. Pat. No. 5,757,695. The elliptic-shaped ferromagnetic memory layer is formed to reduce a production of the edge domains and to promote a single magnetic domain in the entire layer, whereby a magnetization can be uniformly inverted over the entire ferromagnetic memory layer and an inversion magnetic field is reduced.

A ferromagnetic layer having a shape of a parallelogram has been proposed as a memory layer (see Japanese Patent Laid-Open No. H 11-273337). In this case, although edge domains are present, the edge domains do not extend over a large area as in the case of a rectangular shape, and formation of very small domains during magnetization inversion is prevented. Therefore, magnetization of the memory layer can be inverted substantially uniformly. As a result, the inversion magnetic field can be reduced.

As a method of preventing a change of the complicated magnetic structure, magnetically fixing edge domains of the memory layer has been examined (see U.S. Pat. No. 5,748,524 and Japanese Patent Laid-Open No. 2000-100153).

Further, a tri-layered film including two ferromagnetic layers and a nonmagnetic layer interposed therebetween is also introduced as a memory layer for reducing an inversion magnetic field. The tri-layered film includes antiferromagnetic coupling between the two ferromagnetic layers and its magnetization as a whole is relatively lower than a single memory layer having a same shape (see Japanese Patent Laid-Open No. H9-25162, Japanese Patent Application No. H9-263741 and U.S. Pat. No. 5,953,248). The two ferromagnetic layers of the tri-layered film are different in magnetic moments or in their film thickness. Further, the magnetizations of two layers are in antiparallel directions by antiferromagnetic coupling, whereby larger portions of the two magnetizations are effectively cancelled and the tri-layered film as the memory layer is substantially equivalent to a single ferromagnetic layer having a small amount of magnetization in easy magnetization axis direction.

When a magnetic field in a direction inverse to the direction of the easy magnetization axis is provided to the tri-layered memory film, each magnetization of the respective ferromagnetic layers is inverted or changes while maintaining antiferromagnetic coupling. Magnetic force lines of the multi-layered film is closed in the tri-layered film and the influence of a demagnetizing field is inconsiderable, whereby a switching magnetic field of the memory film is determined by a difference of coercive forces between the two ferromagnetic layers, and the switching magnetic field for the multi-layered film is reduced.

Some methods for manufacturing the highly integrated MRAM having memory cells of a submicron size have been researched and method of using an electron beam (EB) drawing for making patterns of the memory cells is described in a journal, W. J. Gallagher et al., J.Appl. Phys. 81,3741 (1997).

SUMMARY OF THE INVENTION

As described above, reducing a switching magnetic field for inverting or changing magnetization of a memory layer/film of a magnetic memory cell is an indispensable factor and tri-layered films in which an antiferromagnetic coupling exists in two ferromagnetic material layers is proposed.

However, when a width of a shorter side of a small ferromagnetic layer is equal to or smaller than about several microns to submicrons, magnetic edge domains at two ends portions different from a magnetic center domain appear under an influence of a demagnetizing field. In regard to the manufacturing method of the TMR device using an EB drawing, back scattering of EB at a surface of metal layer, such as ferromagnetic layers and nonmagnetic material layer, is stronger than a semiconductor material layer, a known proximity effect of considerably widening a provided drawing pattern becomes significant, whereby fineness and controllability of a drawn pattern shape is lost.

As a result, even when a rectangle is intended to be drawn as a shape of a ferromagnetic tunnel junction, the resultant shape lacks sharpness at each of the corners. There is a close relationship between a plane shape of a ferromagnetic tunnel junction of a TMR device and coercive force (Hc) of the ferromagnetic memory layer of the TMR device. Further, a coercive force of ferromagnetic memory layer having rounded corners is about twice as much as the ferromagnetic memory layer having a rectangular shape with sharp corners.

Accordingly, one object of present invention is to provide a cell having a stable magnetic structure in a very small magnetic memory cell to the degree capable of being highly integrated as described above and, at the same time, to reduce a switching magnetic field necessary for writing information to the cell.

Another object of present invention is to use the magnetic memory cell of the stable magnetic structure and the low switching magnetic field in a magnetic memory apparatus, such as nonvolatile and random access memories.

Yet another object of present invention to provide a simple highly productive manufacturing method for a magnetoresistance effect device.

These and other objects are achieved by providing a novel magnetoresistance effect device including a first ferromagnetic layer, a first nonmagnetic dielectric layer formed on the first ferromagnetic layer, and a second ferromagnetic layer formed on the first nonmagnetic dielectric layer. Further, one of the first and second ferromagnetic material layers includes a plane shape in which a center region is disposed between first and second end regions, and the center region has a width narrower than each width of the first and second end regions. A novel manufacturing method is also provided.

BRIEF DESCRIPTION OF THE DRAWINGS

A more complete appreciation of the present invention and many of the attendant advantages thereof is readily obtained as the state becomes better understood by reference to the following detailed description when considered in connection with the accompanying drawings, wherein:

FIG. 14 is a plan view of mask patterns of a manufacturing method of a magnetoresistance effect device according to an eighth embodiment of the present invention;

FIGS. 15A and 15B are a cross-sectional view and a plan view for explaining a method of manufacturing a magnetoresistance effect device according to a ninth embodiment of the present invention;

FIGS. 20A and 20B are a cross-sectional view and a plan view for explaining a manufacturing step after the steps in FIGS. 19A and 19B;

FIGS. 21A and 21B are a cross-sectional view and a plan view for explaining a manufacturing step after the steps in FIGS. 20A and 20B;

FIGS. 24A and 24B are a cross-sectional view and a plan view for explaining a manufacturing step after the steps in FIGS. 23A and 23B;

FIGS. 25A and 25B are a cross-sectional view and a plan view for explaining a manufacturing step after the steps in FIGS. 24A and 24B;

FIGS. 26A and 26B are a cross-sectional view and a plan view for explaining a manufacturing step after the steps in FIGS. 25A and 25B;

FIGS. 27A and 27B are a cross-sectional view and a plan view for explaining a manufacturing method of a magnetoresistance effect device according to a tenth embodiment of the present invention;

FIGS. 32A and 32B are a cross-sectional view and a plan view for explaining a manufacturing step after the steps in FIGS. 31A and 31B;

FIGS. 33A and 33B are a cross-sectional view and a plan view for explaining a manufacturing step after the steps in FIGS. 32A and 32B;

FIGS. 34A and 34B are a cross-sectional view and a plan view for explaining a manufacturing step after the steps in FIGS. 33A and 33B;

FIGS. 35A and 35B are a cross-sectional view and a plan view for explaining a manufacturing step after the steps in FIGS. 34A and 34B;

FIGS. 36A and 36B are a cross-sectional view and a plan view for explaining a manufacturing step after the steps in FIGS. 35A and 35B;

FIGS. 37A and 37B are a cross-sectional view and a plan view for explaining a manufacturing step after the steps in FIGS. 36A and 36B;

FIGS. 38A and 38B are a cross-sectional view and a plan view for explaining a manufacturing step after the steps in FIGS. 37A and 37B;

FIG. 39 is a plan view for explaining a manufacturing method of a magnetoresistance effect device according to an eleventh embodiment of the present invention;

DESCRIPTION OF THE PREFERRED EMBODIMENTS

According to an embodiment of the present invention, the physical shape of at least one ferromagnetic material layer is controlled so the ferromagnetic material layer has a particular magnetic structure that is appropriate for reducing a switching magnetic field by utilizing magnetic edge domains. According to the embodiment of the present invention, edge regions of the ferromagnetic material layer each having the magnetic edge domains are not removed so as to form a parallelogram. Rather, the edge domains are extended by a certain size as described below to promote or utilize its characteristic as a nucleus of magnetization inversion or magnetization change.

Figure 2:
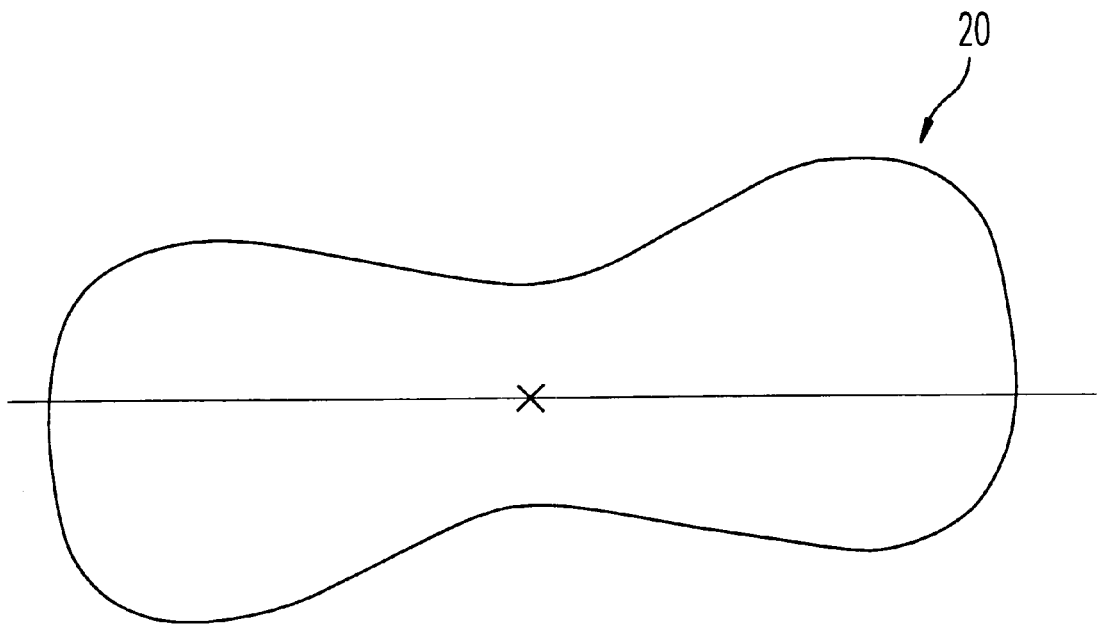
FIG. 2 is a plan view of a ferromagnetic material layer of a TMR device according to a first embodiment of present invention.

Turning now to FIG. 2, which is a plan view of a ferromagnetic layer 20 according to a first embodiment of the present invention. As shown, the ferromagnetic layer 20 has a plane shape and includes a center portion formed between two end portions so as to align with each other. Each of the end portions has a width wider than the center portion, and has an extended additional portion. Further, each of the extended portions of the ferromagnetic layer can be thought of as being added to a rectangular-shaped ferromagnetic layer. Further, each of the extended portions are substantially symmetrical aligned to each other with a substantial center point (x) of the ferromagnetic material layer 20 as a pivot. Although each of the extended additional portions in FIG. 2 are substantially symmetrical aligned with the substantial center point (x) as the pivot, a precise adjustment of their symmetry and proportional breadth is not required and both extended portions may be unsymmetrical and have different breadths from each other. In addition, the plane shape shown in FIG. 2 is not symmetric to the straight line in FIG. 2 indicating an easy magnetization axis of the ferromagnetic layer 20. In the ferromagnetic layer 20 of the above-described shape, an S-shape magnetic domain structure is formed and stabilized, whereby the switching magnetic field is substantially reduced.

The above-described plane shape may also be applied to a multi-layered memory film including a plurality of ferromagnetic layers to reduce the switching field.

Figure 3:
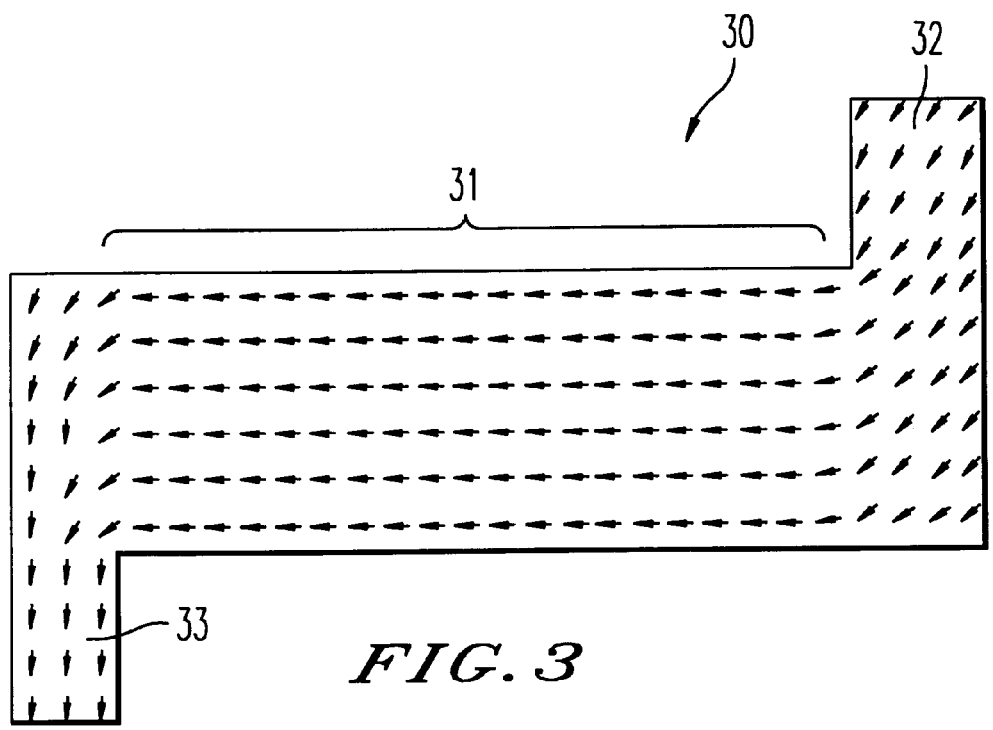
FIG. 3 is a plan view of a ferromagnetic layer with an arrow indicating its magnetization direction according to a second embodiment of the present invention.

Turning now to FIG. 3, which is a plan view of a ferromagnetic layer including arrows for indicating a magnetization of the ferromagnetic layer according to a second embodiment of the present invention.

As shown, the ferromagnetic layer 30 has hooked-portions 32 and 33 at end portions to form an S-like shape. Further, the widths of the hooked-portions are different from a width of the center portion 31. The center portion 31 has a continuous width of 0.1 $\mu$m and each end portion 32 and 33 has a width of 0.15 $\mu$m. The layer 30 also has a length of 0.4 $\mu$m and an average thickness of 1.5 $\mu$m.

The widths of the two end portions can be different from each other. The magnetization free layer or film receives a stray magnetic field of the magnetization pinned layer, whereby its magnetization hysteresis under a one-directional magnetic field that is in parallel to the longer axis of the magnetization free layer may be different from its magnetization hysteresis under another magnetic field that is in anti-parallel relation to the one-directional magnetic field. The difference in widths of the two end portions may reduce an effect of the difference in magnetization hysteresis and equalize the magnetization free layer's coercive forces in two directions.

Although the shape of FIG. 3 is polygonal in which the respective corners are provided with an angle of 90 degrees, the angle of each corner is not limited to 90 degrees and the respective sides are not necessarily limited to straight lines but may have curved lines. The device size is also not limited to the above-described size, and depending on a degree of integration, a maximum width of the layer 30 may be preferably smaller than about 1 $\mu$m and the length of the layer 30 may be preferably 1 through 10 times as large as the maximum width. The average thickness of the ferromagnetic material layer is also preferably equal to or smaller than 10 nm and more preferably equal to or smaller than 5 nm.

The magnetic material for the ferromagnetic layer 30 may be one of the normally used magnetic materials such as Fe, Co, Ni, an alloy, such as $Co_9Fe$, or the equivalents. A laminated film including a layer of the material can also be used in place of the ferromagnetic layer 30. The ferromagnetic layer 30 may also be substituted with a laminated film including a nonmagnetic material layer including Cu, Au, Ru, Al or their equivalents.

Figure 4:
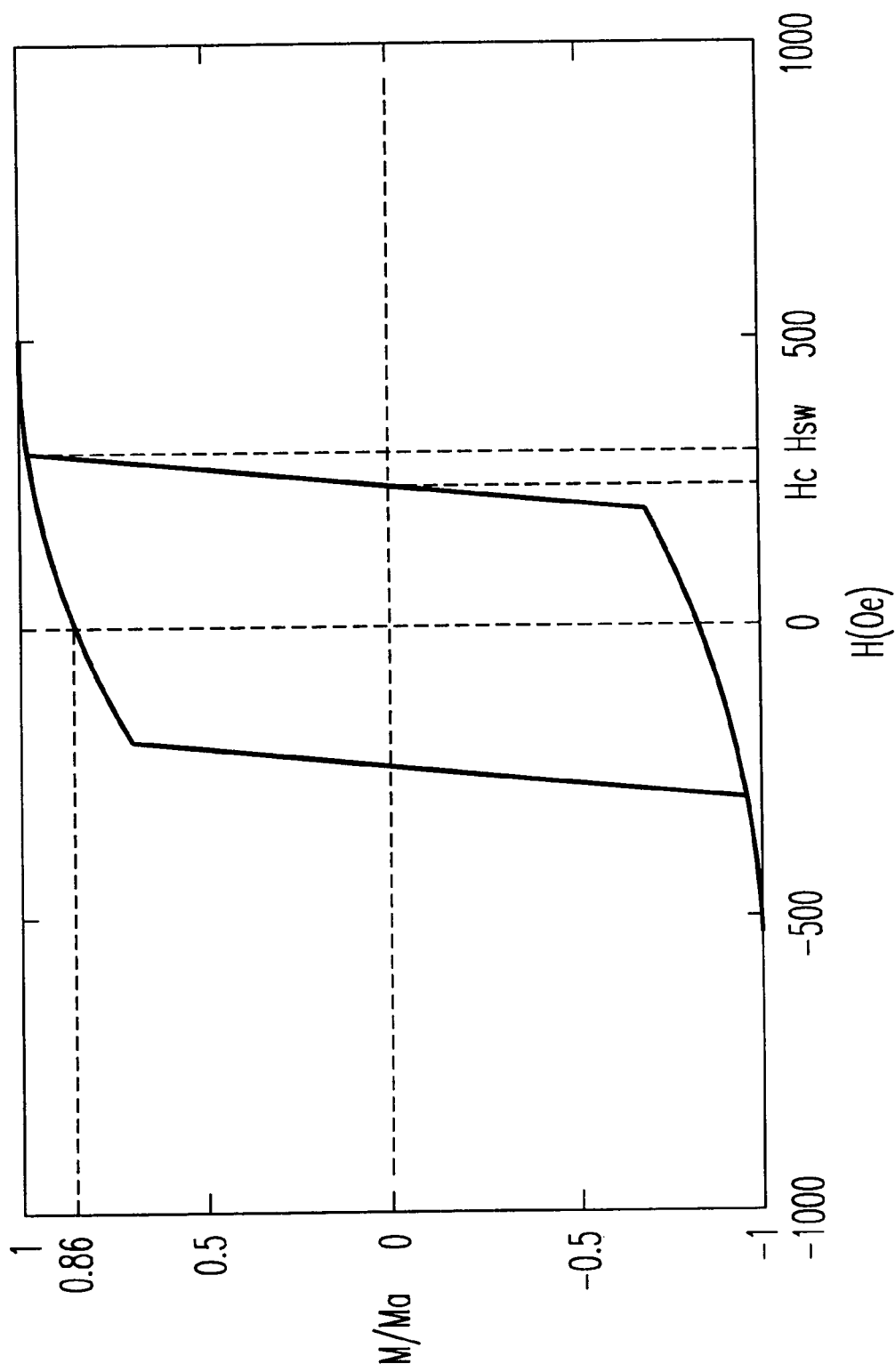
FIG. 4 is a magnetization hysteresis diagram of the magnetoresistance effect device according to the second embodiment of the present invention.

Next, FIG. 4 is a diagram illustrating results of a magnetization hysteresis of the ferromagnetic layer 30 of $Co_9Fe$. The center portion 31 of the layer 30 had a width of 0.1 $\mu$m and each of the end portions had a width of 0.15 $\mu$m. Further, a length of the layer 30 was 0.4 $\mu$m and a thickness was 1.5 nm. The coercive force Hc was calculated as 242 (Oe) from the hysteresis of FIG. 4 and a difference between the switching magnetic fields Hsw and the coercive force Hc is not so large that no small magnetic domains are produced, even with the complicated plane shape of the layer 30. Thus, the magnetization inversion procedure is smoothly processed.

The above-described plane shape can also be applied to a multi-layered memory film including a ferromagnetic layer, for reducing the switching field of the multi-layered memory film.

Turning next to FIGS. 5A–5F, which are plan views of the ferromagnetic material layer illustrating the magnetization change according to the second embodiment of the invention.

Figure 5A:
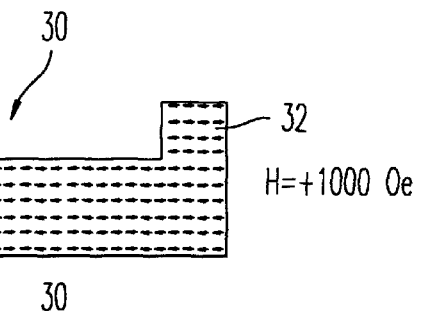
FIGS. 5A–5F are plan views showing a process of magnetization inversion a ferromagnetic material layer of a magnetoresistance effect device according to the second embodiment of the present invention.
Figure 5B:
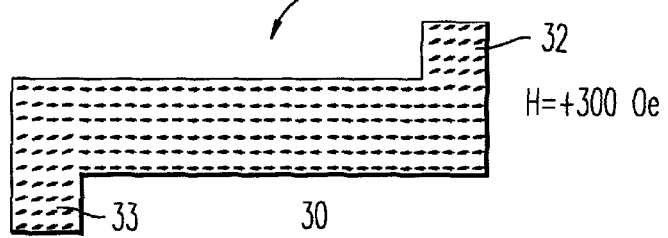
Figure 5C:
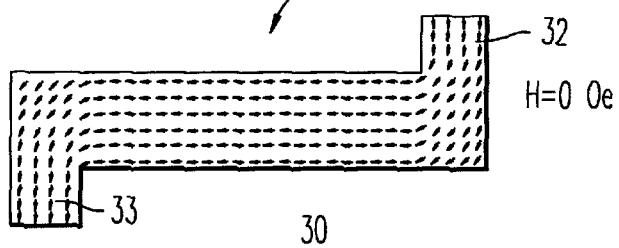

FIG. 5A corresponds to an applied magnetic field H of +1000 (Oe) directed from right to left in the drawing. As shown, the magnetization of the ferromagnetic material layer 30 is aligned with the applied magnetic field and the layer's easy magnetization axis. FIG. 5B corresponds to an applied magnetic field of +300 (Oe) directed from right to left in the drawing and has a magnetization as shown by the arrows in FIG. 5B. As shown, when the applied magnetic field H is +300 (Oe), the magnetization directions of the hooked-portions 32 and 33 begin to change from the easy magnetization axis. FIG. 5C corresponds to a zero applied magnetic field, and as shown a stable magnetic domain structure having an S-shape is formed in the ferromagnetic layer 30.

Figure 5D:
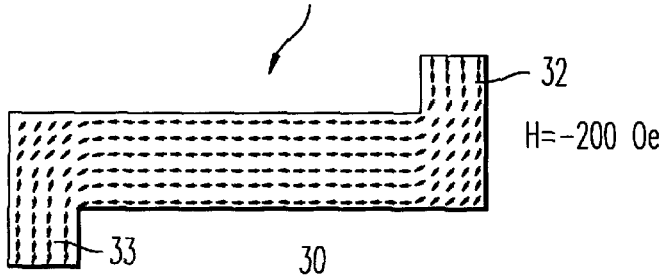
Figure 5E:
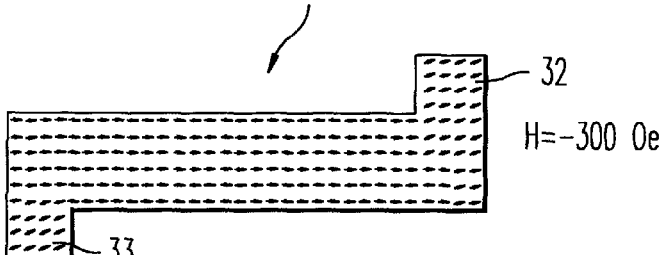
Figure 5F:
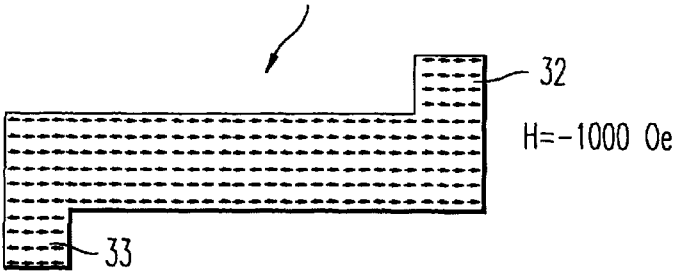

Further, FIG. 5D corresponds to an applied magnetic field of −200 (Oe) directed from left to right. As shown, the magnetization direction of the ferromagnetic layer 30 is significantly rotated at the end portions of the wider width. FIG. 5E corresponds to an applied magnetic field of −300 (Oe) directed from left to right. As shown, the magnetization of the ferromagnetic layer 30 is substantially inverted. Also, FIG. 5F corresponds to an applied magnetic field of −1000 (Oe) directed from left to right. As shown, the magnetization of the ferromagnetic layer 30 is completely inverted, and is directed from left to right in alignment with the easy magnetization axis.

In magnetization inversion, the edge domains are enlarged while two domain walls between each of the edge domains and the center magnetic domain move in the direction toward the center of the layer. Therefore, complicated domain structures are not formed through the entire magnetization inversion and smooth magnetization inversion of a small switching magnetic field is attained.

Because of the presence of the edge domains, a rate of residual magnetization to saturation magnetization is 0.86. Generally, when there is a disturbance in a magnetization direction of a ferromagnetic layer and the rate of residual magnetization to saturation magnetization is smaller than 1, a ferromagnetic tunnel junction may have a reduced tunnel MR amplitude compared to a tunnel junction in which the magnetization of ferromagnetic layer has no disturbance. When the ferromagnetic tunnel junction including the two ferromagnetic layers with a nonmagnetic dielectric layer deposited therebetween is formed in the same shape, the two ferromagnetic layers tend to have a substantially similar or high symmetry magnetic domain structures. Therefore, although the rate of the residual magnetization to the saturation magnetization is smaller than 1, the tunnel magnetoresistance is hardly reduced.

Figure 6:
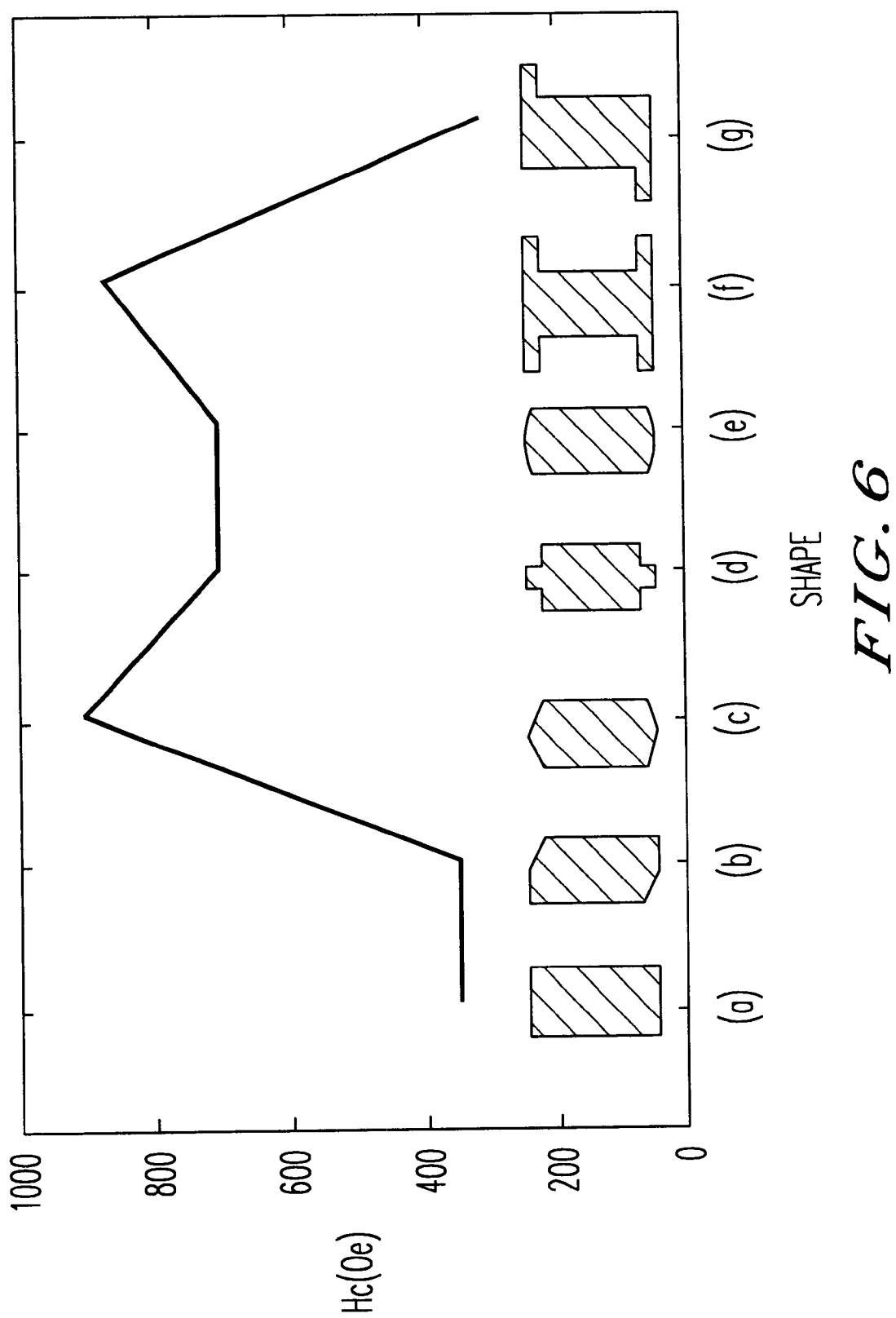
FIG. 6 is a diagram comparing a coercive force of the ferromagnetic material layer of the magnetoresistance effect device according to the second embodiment of the present invention with coercive forces of other devices having various shapes.

Next, FIG. 6 is a diagram illustrating a relationship between several plane shapes (a)–(g) of a ferromagnetic layer and their respective coercive forces Hc (Oe). The coercive forces of the seven ferromagnetic layers were calculated when the layer had a thickness of 2.0 nm, a length of 0.4 μm, a width of the center portion of 0.1 μm. Further, a width of the end portions was 0.15 μm for the plane shapes (f) and (g).

As shown, the ferromagnetic layer having the least coercive force has the shape (g). The coercive force of the plane shape (b) which has two diagonally opposed cut-off corners from a rectangular shape is also low for the same reason as the parallelogram-shaped ferromagnetic layer.

Figure 1A:
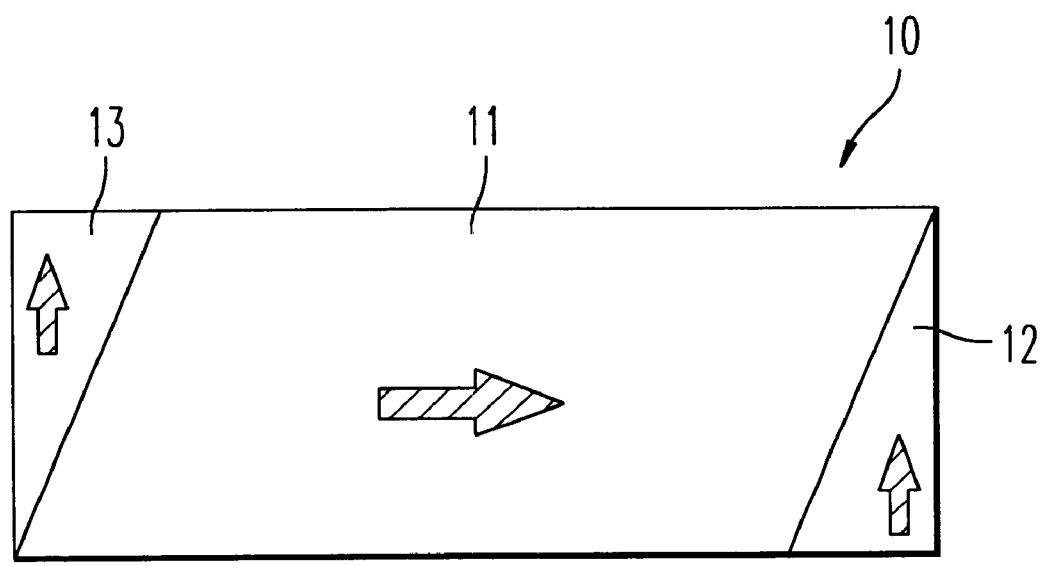
FIGS. 1A and 1B are plan views of a ferromagnetic material layer and its magnetic structure.
Figure 1B:
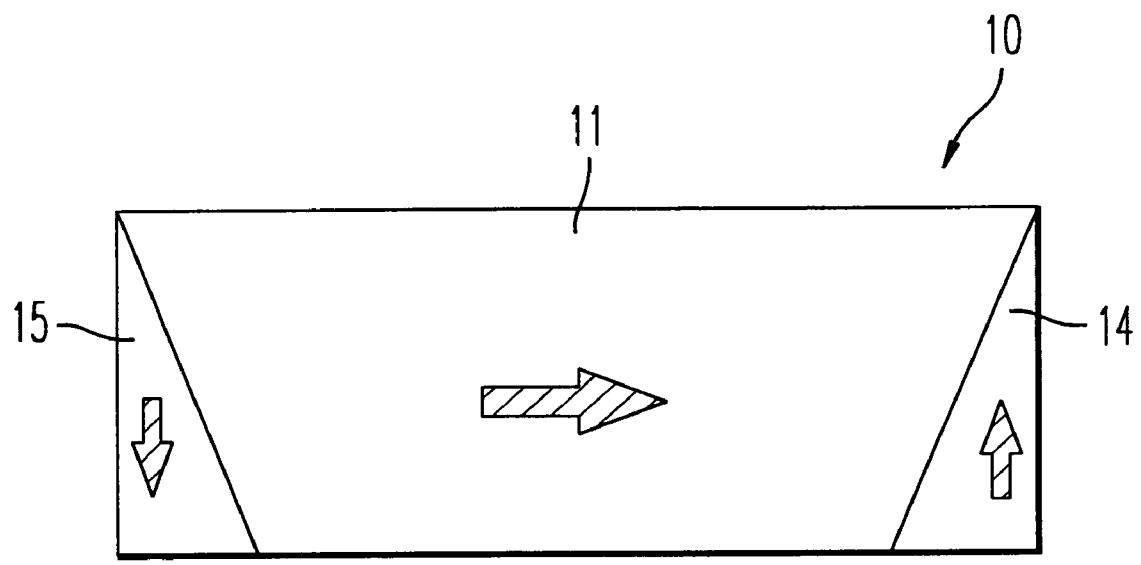
Figure 7A:
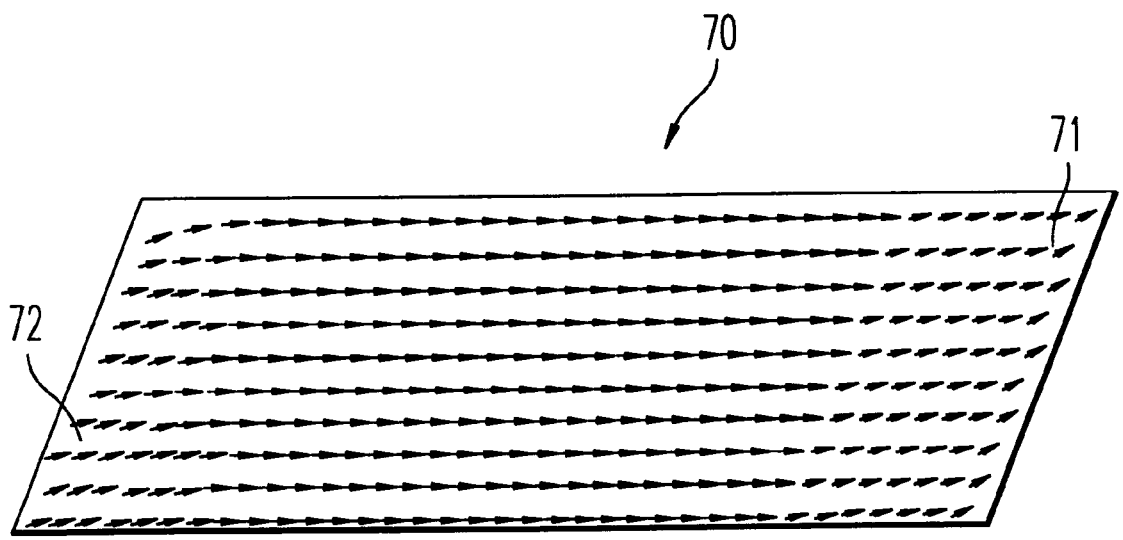
FIG. 7A is a view of a ferromagnetic material layer of a comparative example with an arrow indicating its magnetization direction.

FIG. 7A is a plan view of a parallelogram-shaped ferromagnetic layer 70 with arrows indicating the magnetic domain structure. In the parallelogram-shaped ferromagnetic layer 70, a magnetization of only small portions 71 and 72 along an oblique side is directed in a direction different from an easy magnetization axis to which the magnetization of the center portion is aligned. The total magnetization of the edge domains is less than the conventional rectangular-shaped ferromagnetic layer 11 in FIGS. 1A and 1B, but is more than the ferromagnetic layer 30 in FIG. 3.

Figure 7B:
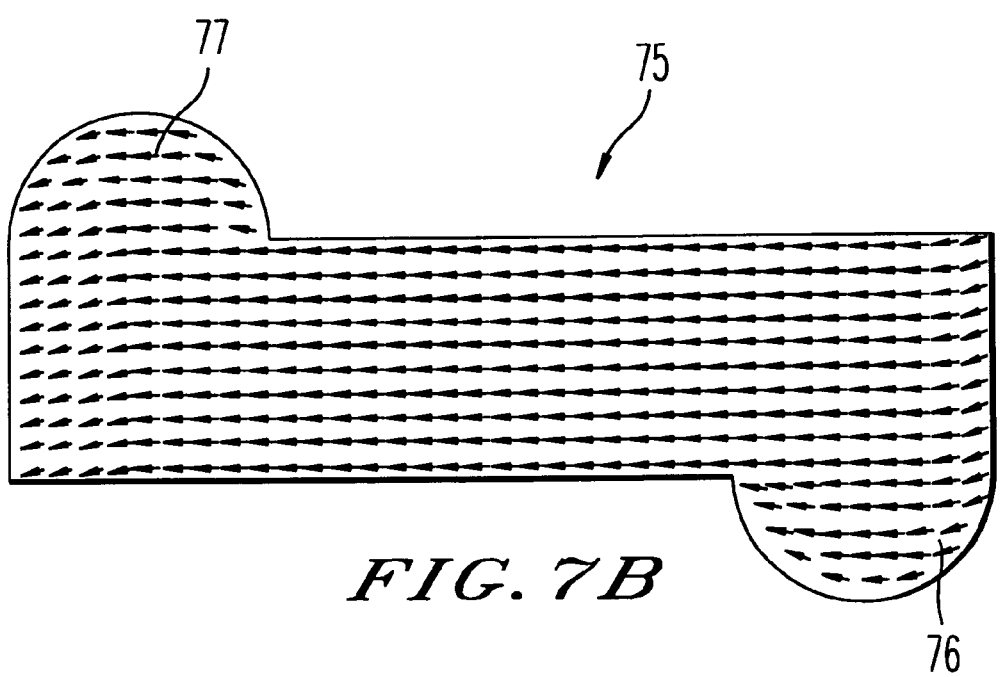
FIG. 7B is a plan view of a magnetoresistance effect device with an arrow indicating its magnetization direction according to a third embodiment of the present invention.

Now, FIG. 7B is a plan view of a ferromagnetic layer of a magnetoresistance effect device according to a third embodiment of the present invention.

As shown, the ferromagnetic layer 75 has semicircle-shaped extended portions 76 and 77. Further, the semicircle-shaped extended portions 76 and 77 have a gradually changing magnetization as indicated by the arrows in FIG. 7B. The layer's magnetic domains were calculated for a ferromagnetic material of Co$_9$Fe. Other magnetic materials such as Fe, Co, Ni, or their alloys and a laminated film of the ferromagnetic material layers can also be used. The laminated film may also have a nonmagnetic metal layer including Cu, Au, Ru, Al or the equivalents.

Figure 8:
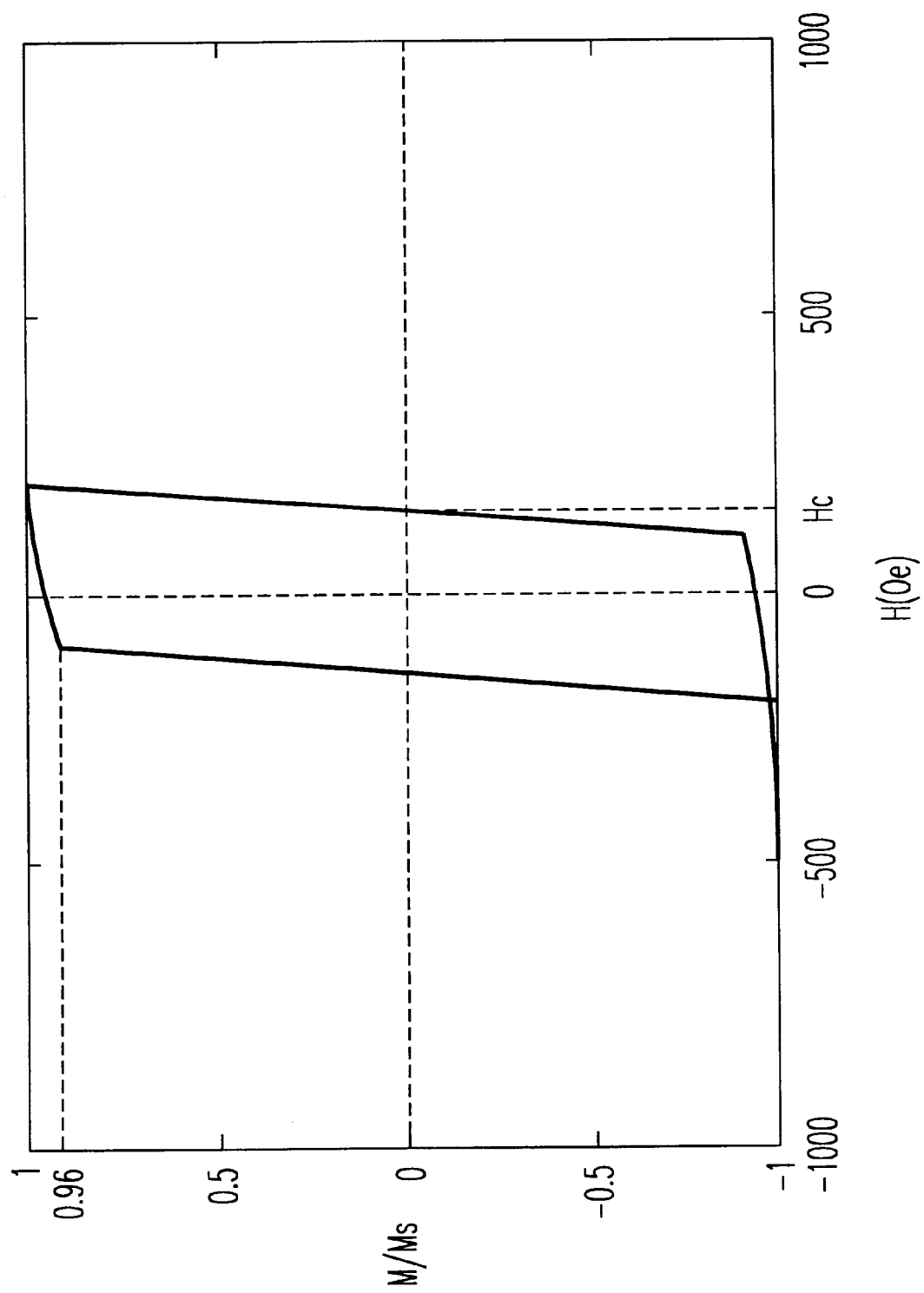
FIG. 8 is a magnetization hysteresis diagram of a magnetoresistance effect device according to a third embodiment of the present invention.

FIG. 8 is a diagram of a calculated magnetization curve of the ferromagnetic layer in FIG. 7B according to the third embodiment of the present invention. As shown, the coercive force Hc was as low as 148 (Oe) and a rate of residual magnetization to saturation magnetization was as high as 0.96. A similar effect may also be obtained with a multi-laminated film which includes at least two ferromagnetic layers and at least a nonmagnetic dielectric layer and/or a nonmagnetic metal layer interposed between the two ferromagnetic layers.

Figure 9A:
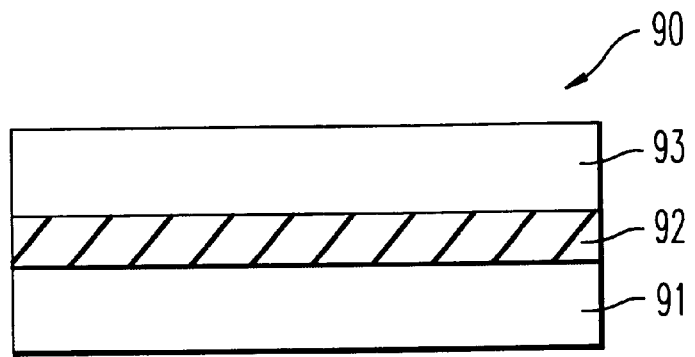
FIGS. 9A and 9B are cross-sectional views of magnetoresistance effect devices according to a fourth embodiment of the present invention.
Figure 9B:
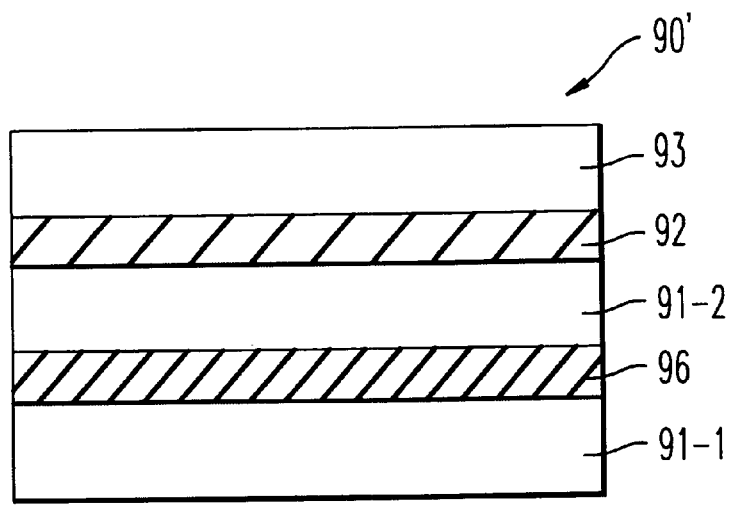

Turning now to FIGS. 9A and 9B, which are sectional views of magnetoresistance effect devices 90 and 90' according to a fourth embodiment of the present invention.

As shown, the magnetoresistance effect device 90 includes a ferromagnetic single tunnel junction formed with a first ferromagnetic layer 91, a second ferromagnetic layer 93, and a nonmagnetic dielectric layer 92 interposed between the two ferromagnetic layers 91 and 93. In this structure, at least one of the first and second ferromagnetic layers is a memory layer and its magnetization rotates in an applied field. By adopting the above-described plane shape to at least the memory layer of the device, the device can also attain a small coercive force. The plane shape can also be applied to all layers of the device.

A spin valve magnetoresistance effect element can also be obtained by forming an antiferromagnetic layer on either one of the first or second ferromagnetic layers 91 and 93 so as to fix the magnetization of the ferromagnetic layer adjacent to the antiferromagnetic material layer by antiferromagnetic exchange coupling the ferromagnetic layer and the antiferromagnetic layer, whereby the magnetization fixed ferromagnetic layer is a magnetization fixed layer (a reference layer).

The magnetoresistance effect device of FIG. 9B has a three-layered film including two ferromagnetic material layers 91-1 and 91-2 with a nonmagnetic metal layer 96 disposed therebetween in place of the first ferromagnetic layer 91 in FIG. 9A. The three-layered film can also be used in place of the ferromagnetic layer 93. The multi-layered film of three or larger number laminated of ferromagnetic layers and nonmagnetic layers can also be used as the first and the second ferromagnetic layers. The above-described plane shape can be adapted to at least of the ferromagnetic layers of the memory layer.

Further, each of the ferromagnetic layers 91 and 93 in FIG. 9A, 91-1 and 93 in FIG. 9B can be used as an electrode coupled to lines, such as a bit line and word line for providing a sense current.

Figure 10:
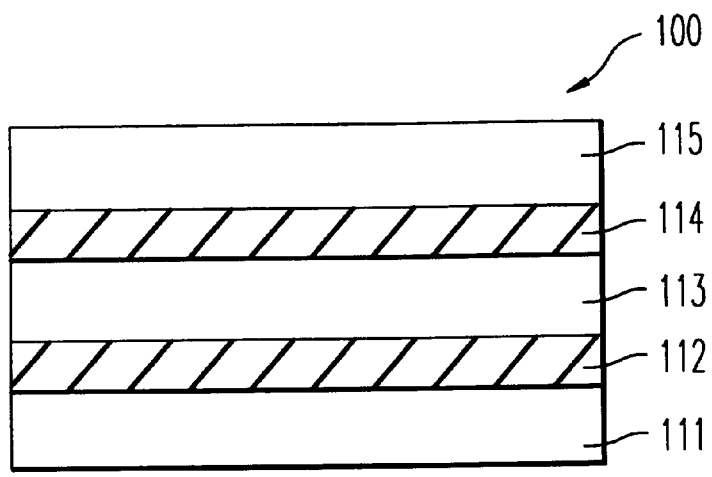
FIG. 10 is a cross-sectional view of a magnetoresistance effect device according to a fifth embodiment of the present invention.

Next, FIG. 10 is a sectional view of a magnetoresistance effect device 100 according to a fifth embodiment of the present invention.

As shown, a first ferromagnetic layer 111 and a second ferromagnetic layer 113 are laminated with a first nonmagnetic dielectric layer 112 disposed therebetween. The device also has a second nonmagnetic dielectric layer 114 formed on the second ferromagnetic layer 113 and a third ferromagnetic layer 115 with a second nonmagnetic dielectric layer 114 interposed therebetween.

The laminated structure of the magnetoresistance effect device 100 may have a small coercive force by adopting the plane shape of the first through the third embodiments to at least one of the ferromagnetic memory layers. A spin valve TMR device can also be formed with antiferromagnetic layers each formed on the first and the third ferromagnetic layers 111 and 115 so the ferromagnetic layers become magnetization fixed reference layers. Further, each of the ferromagnetic layers 111 and 115 can be used as an electrode coupled to sense current lines, such as a bit line and word line.

Figure 11:
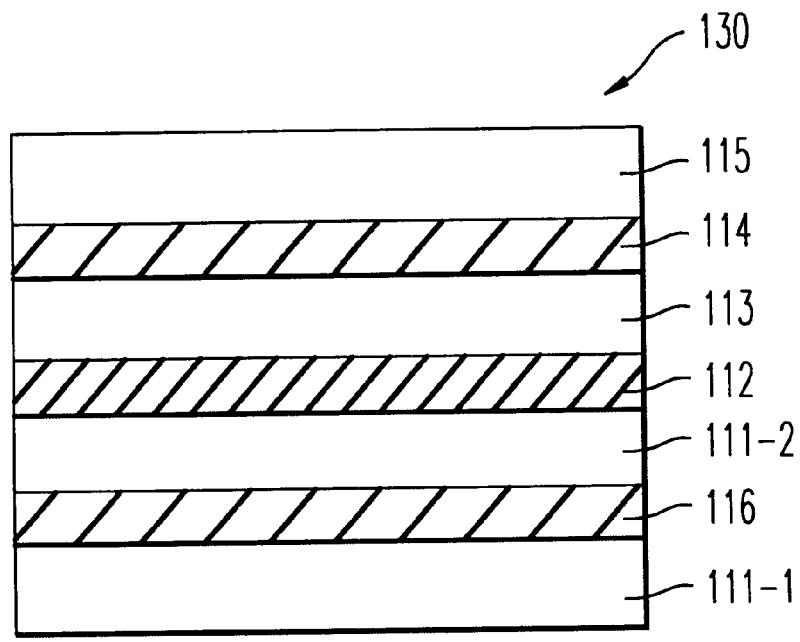
FIG. 11 is a cross-sectional view of a magnetoresistance effect device according to a sixth embodiment of the present invention.

Next, FIG. 11 is a sectional view of a magnetoresistance effect device 130 according to a sixth embodiment of the present invention.

As shown, the magnetoresistance effect device 130 has a three-layered film, in which two ferromagnetic layers 111-1 and 111-2 sandwich a nonmagnetic metal layer 116, in place of the ferromagnetic layer 111 in FIG. 10. The three-layered film forms an antiferromagnetic coupling memory layer with the nonmagnetic metal layer 116 as an antiferromagnetic coupling layer.

Further, the antiferromagnetically coupling nonmagnetic metal layer 116 antiferromagnetically couples the two ferromagnetic layers 111-1 and 111-2. The antiferromagnetic coupling three-layered film is disclosed in Japanese Patent Laid-Open No. 09-25162, Japanese Patent Application No. 09-263741 and U.S. Pat. No. 5,953,248, their entire contents of which are incorporated by reference. The three-layered film may also be used in place of the third ferromagnetic layer 115. The magnetoresistance effect device 130 with a small coercive force can be attained by using the above-described plane shape to at least one of the ferromagnetic layers as a memory layer.

Figure 12:
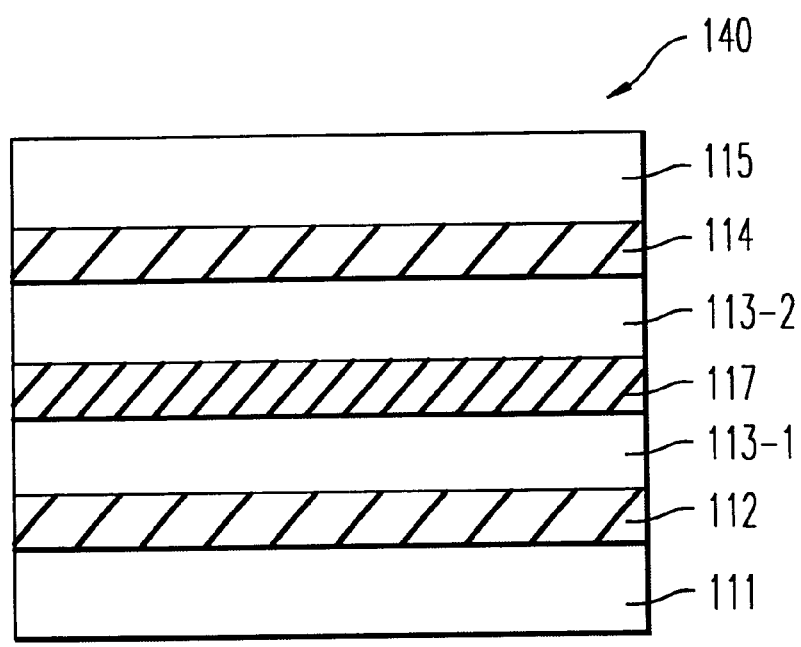
FIG. 12 is a cross-sectional view of a magnetoresistance effect device according to a seventh embodiment of the present invention.

FIG. 12 is a cross sectional view of a magnetoresistance effect device 140 according to a seventh embodiment of the present invention.

As shown, the magnetoresistance effect device 140 has a three-layered film, in which ferromagnetic layers 113-1 and 113-2 are laminated by interposing a nonmagnetic layer 117, in place of the second ferromagnetic layer 113 in FIG. 10. The three-layered film behaves as a memory film, where the magnetization of the two ferromagnetic layers 113-1 and 113-2 invert or change while the two ferromagnetic layers 113-1 and 113-2 are antiferromagnetically coupled with each other with the nonmagnetic layer 117 as a metal coupling layer. The magnetoresistance effect device 140 in FIG. 12 also has a small coercive force by adapting the plane shapes of the first through the third embodiments to the memory film. Either one of the first and the third ferromagnetic layers 111 and 115 can also be replaced with the three-layered film.

Figure 13:
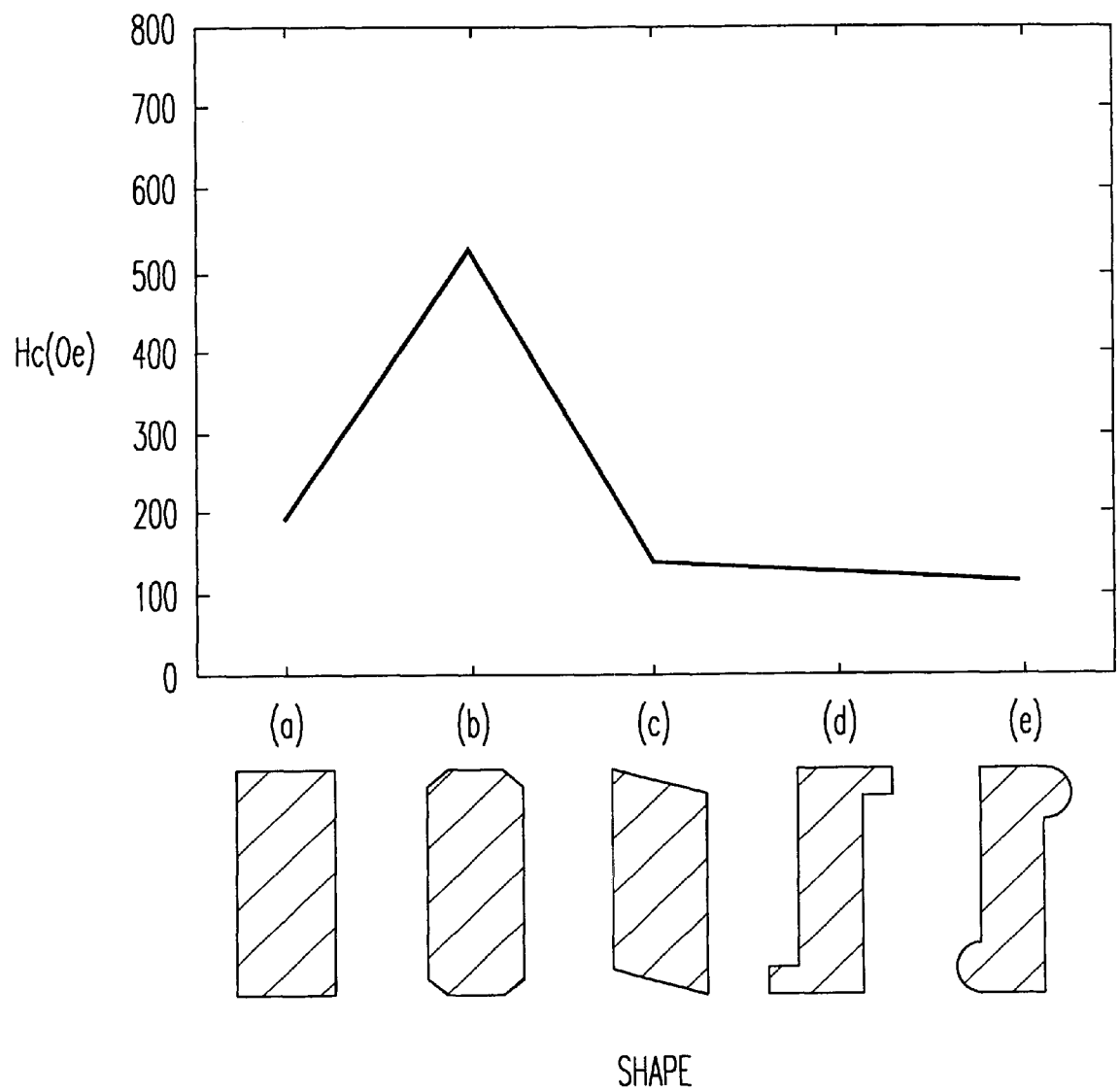
FIG. 13 is a diagram comparing a coercive force of memory films of various shapes.

Next, FIG. 13 is a diagram of a relationship between several plane shapes of a memory film and their respective coercive forces Hc (Oe). The memory film has the three-layered film of $Co_9Fe$ ferromagnetic layer, Ru nonmagnetic metal layer and $Co_9Fe$ ferromagnetic layer. The Ru nonmagnetic metal layer is a coupling layer for forming an antiferromagnetic coupling between the two ferromagnetic layers. As shown, the coercive force can also be significantly reduced with the shapes (d) and (e) according to the embodiments of the present invention in comparison with normal rectangular shapes.

A material of the ferromagnetic layer according to the respective embodiments of the present invention, is not particularly limited to the above-described material, and Fe, Co, Ni, Fe alloy, Co alloy, Ni alloy, magnetite having a large spin polarizability, oxides ferromagnetic material, such as $CrO_2$, $RXMnO_{3-y}$ (R: rare earth, X:Ca, Ba, Sr), Heusler alloys, such as NiMnSb and PtMnSb, magnetic semiconductors, such as ZnMnO, TiMnO, $CdMnP_2$ and $ZnMnP_2$ and their equivalents can also be used.

A thickness of each ferromagnetic layer explained in the respective embodiments of the present invention is preferable in an appropriate range for preventing superparamagnetic characteristic of the ferromagnetic material. It is preferable the thickness may be equal to or larger than 0.4 nm. When the thickness is excessively thick, the switching magnetic field is enlarged. Therefore, it is preferable the thickness is equal to or smaller than 2.5 nm as an upper limit value. A nonmagnetic element, such as Ag, Cu, Au, Al, Mg, Si, Bi, Ta, B, C, O, N, Pd, Pt, Zr, Ir, W, Mo, Nb or their equivalents, may also be included in the ferromagnetic layer, such that its ferromagnetic characteristic is not lost as a whole. FeMn, PtMn, PtCrMn, NiMn, IrMn, NiO or their equivalents can also be used for the antiferromagnetic film.

Cu, Au, Ru, Ir, Rh, Ag or their equivalents can be used for the nonmagnetic metal layer. The nonmagnetic layer as an antiferromagnetic or ferromagnetic coupling layer includes the metal material. The nonmagnetic coupling layer magnetically couples the two ferromagnetic layers stacked via the nonmagnetic coupling layer. When the magnetic coupling of the two ferromagnetic layers is antiferromagnetic coupling, the nonmagnetic coupling layer may include Ru, Ir, Rh, or their equivalents. When the magnetic coupling between the two ferromagnetic layers is ferromagnetic coupling, the nonmagnetic material layer may include Cu, Au, Ag or their equivalents. The three-layered film utilizing ferromagnetic coupling is preferably used as the magnetic memory film and the three-layered film utilizing the anti-ferromagnetic coupling is preferably used as the reference layer, but they can be used as both the memory layer and the reference layer.

For a dielectric layer or a nonmagnetic dielectric layer used in the respective embodiments of the present invention, various dielectric materials can be used, such as $Al_2O_3$, $SiO_2$, MgO, AlN, AlON, GaO, $Bi_2O_3$, $SrTiO_2$, $AlLaO_3$ and their equivalents. The presence of oxygen or nitrogen deficiency of these dielectric layers is also permissible. A thickness of the tunnel dielectric material layer is dependent on a junction area of the TMR. It is preferable the thickness of the dielectric layer is equal to or smaller than 3 nm. The magnetoresistance effect device can also be formed on various substrates of Si, $SiO_2$, $Al_2O_3$, AlN and their equivalents. It is preferable to use a layer of Ta, Ti, Pt, Pd, Au or their equivalents, or a laminated film of Ti layer and Pt layer, Ta layer and Pt layer, Ti layer and Pd layer, Ta layer and Pd layer or their equivalents between the substrate and lower surface of the magnetoresistance effect device, and/or to use at least one of them on an upper surface of the magnetoresistance effect device.

The above-described plane shapes including several conventional shapes can also be formed by a process including coating a resist layer after forming the layer(s), forming a resist pattern on the formed layer(s) by applying light, an electron beam and an X ray onto the resist layer to form an exposed images, and by developing the exposed image of the resist layer. The process also includes performing ion milling or etching using the resist pattern as a mask pattern, thereby forming a single or a plurality of patterns. Further, the resist pattern will usually be exfoliated. Each step of the process can also be replaced by its equivalent step or modified using different materials or employing additional step(s).

When manufacturing magnetoresistance effect devices having a relatively large size, for example in a micron order, a mask pattern of silicon dioxide, silicon nitride or their equivalents for plurality of the magnetoresistance effect device patterns according to the present invention can be formed by using Reactive Ion Etching (RIE).

To form relatively small magnetoresistance effect devices of the above-described shapes, for example from 0.1 μm through about 3 μm, photolithography can be used. In this case, a previously fabricated mask having a plurality of shapes of the magnetoresistance effect device of the embodiment of the present invention can be used, and etching can be performed in accordance with the mask.

With regard to a device having a smaller size, for example about 0.5 μm or smaller, EB exposure can be used. However, because the device is small per se, forming patterns of the magnetoresistance device with minute edge portions is more difficult.

To manufacture the device of such a small size, the electron beam can be corrected. Normally, the correction of the electron beam is used to form an appropriate pattern by correcting a proximity effect caused by back scattering of the electron beam at a surface of the substrate supporting the device. When forming a rectangular plane shape, an accumulated charge amount at a vicinity of an apex is deficient and the four corners of the rectangular shape become round. To make the corners substantial right angles, the correction point beam is applied onto an outer side of the rectangular to increase the accumulated charge amount at the corners, especially for a device of about 0.5 µm or smaller. This method can also be used in a manufacturing method of the magnetoresistance effect device of the present invention, as described blow. For example, for forming the devices of FIG. 3 or 7B, a rectangular shape as a basic pattern is formed and an additionally applied correction beam at both diagonal corners can be used to form the end portions.

The appropriate plane shape in FIG. 3 or 7B can be provided by making an impacted charge amount of the beam larger than normal proximity effect correction, and/or by adjusting a position of the correction point beam. To form the shape of the device in FIG. 7B, a correction point beam may be irradiated on a plurality of points at the edge portions.

The correction beam for forming the end portions can also be impacted after forming the device in the rectangular shape, however, it is necessary to realize a small rectangular shape of submicron order at a preceding stage.

Turning next to FIG. 14, which is a plan view of mask patterns of a manufacturing method of a magnetoresistance effect device according to an eighth embodiment of the present invention. The eighth embodiment is focused on a method of realizing the small rectangular shape of sub micron order at a preceding stage.

When a rectangular shape is formed by a normal one-shot lithography, the corners of the rectangular are significantly lost when one side of the rectangular is equal to or smaller than about 0.5 µm in photolithography and equal to or smaller than about 0.2 µm in EB lithography. As a countermeasure against this problem, a proximity effect correction against reflection of light in the photolithography and proximity effect correction against back scattering of electrons in EB lithography have been studied. However, a problem with this countermeasure is the correcting operation needs additional time, and it is rather difficult to achieve a sufficient effect with the size of about 0.1 µm.

On the other hand, controlling a width of a linear pattern in lithography can accurately prescribe a width equal to or smaller than 0.2 µm even in photolithography and a width equal to or smaller than 0.1 µm in EB lithography. To form a desired rectangular pattern 151 (hatched portion) in FIG. 14, a first linear pattern 152 is first formed by lithography so as to form a mask layer and the other region is removed by dry etching. A second linear pattern 153 is then formed by lithography to be orthogonal to the first linear pattern to form a mask, and a remaining region outside of the rectangle is removed by dry etching. Thus, a sharp pattern can be formed at the corner 154 of the rectangular pattern.

Magnetoresistance effect devices having various shapes can also be formed by modifying the method in FIG. 14, as described in the following embodiments.

FIGS. 15A–26B are views for explaining a method of manufacturing a magnetoresistance effect device according to a ninth embodiment of the present invention. Although these figures show one pattern of the magnetoresistance effect device, the manufacturing method for an integrated memory apparatus may include forming a plurality of the same magnetoresistance effect devices on one substrate. Further, the method for the integrated memory apparatus can be achieved in reference to the following explanation. The method of manufacturing can form a Magnetic Tunnel Junction (MTJ) of a TMR device with sharp corners by repeating the linear pattern formation and etching.

FIG. 15A is a cross-sectional view along with the line 15A—15A of a plan view of FIG. 15B. As shown, a wiring 162 of Ta, a MTJ film 163 which includes a ferromagnetic layer, a nonmagnetic dielectric layer and a ferromagnetic layer, and a contact layer 164 of Ta are formed on a main surface of a Si substrate 161.•A region 165 surrounded by a broken-line corresponds to a pattern where the MTJ of the TMR device is going to be formed. The MTJ film may also include ferromagnetic material particles and/or a multi-layered film including a ferromagnetic material in place of the ferromagnetic layer(s).

Figure 16A:
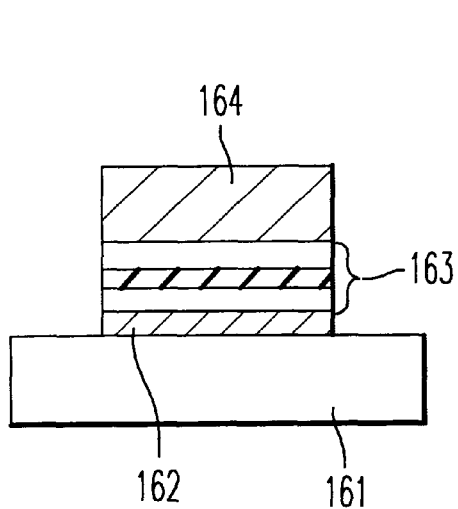
FIGS. 16A and 16B are a cross-sectional view and a plan view for explaining a manufacturing step after the steps in FIGS. 15A and 15B.
Figure 16B:
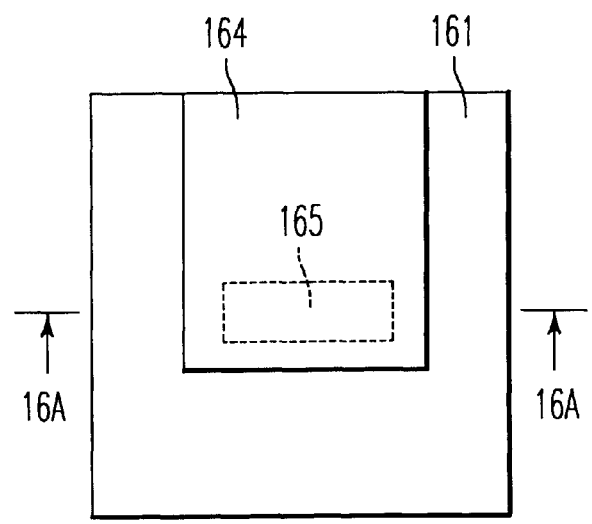

FIG. 16A is a cross-sectional view along a line 16A—16A of a plan view of FIG. 16B for explaining a manufacturing step following FIGS. 15A and 15B. A pattern of the wiring 162 is formed by photolithography, and a pattern of the wiring 162, the MTJ film and the contact layer 164 are formed by etching using RIE in a presence of a mixture gas of $Cl_2$ and Ar using a resist (not illustrated), formed by photolithography, as a mask.

Figure 17A:
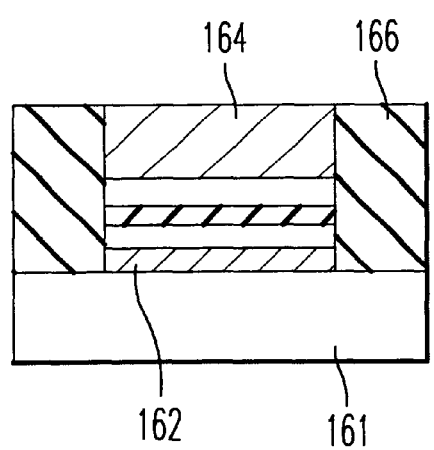
FIGS. 17A and 17B are a cross-sectional view and a plan view for explaining a manufacturing step after the steps in FIGS. 16A and 16B.
Figure 17B:
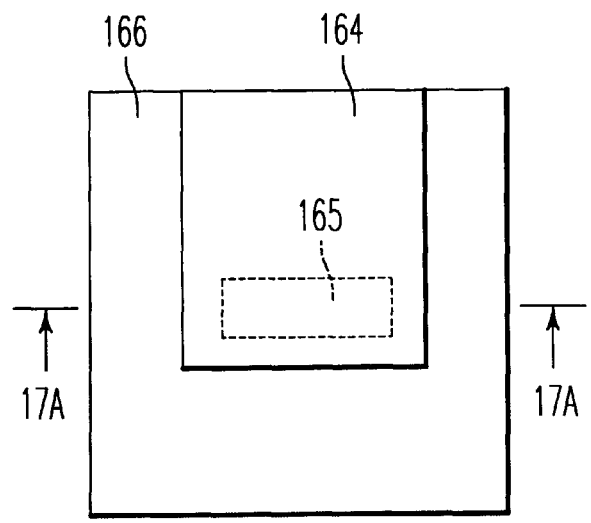

FIG. 17A is a cross-sectional view along a line 17A—17A of a plan view of FIG. 17B for explaining a manufacturing step following FIGS. 16A and 16B. Side surfaces of the pattern of wiring 162, the MTJ film 163 and the contact layer 164 are surrounded with a nonmagnetic dielectric layer 166 of $SiO_x$, and the surfaces of the contact layer 164 and the nonmagnetic dielectric layer 166 of $SiO_x$ are flattened by a Chemical Mechanical Polishing (CMP) or an etch-back process.

Figure 18A:
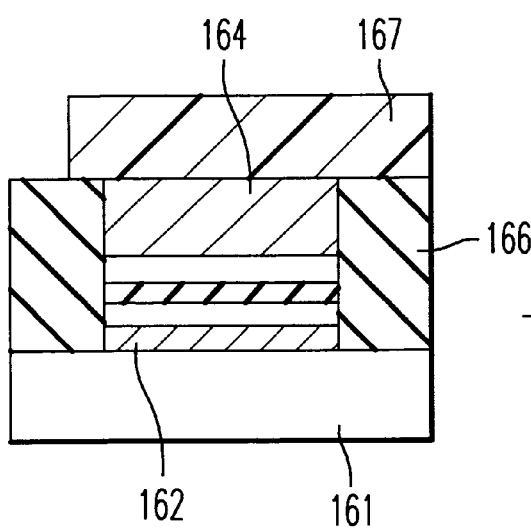
FIGS. 18A and 18B are a cross-sectional view and a plan view for explaining a manufacturing step after the steps in FIGS. 17A and 17B.
Figure 18B:
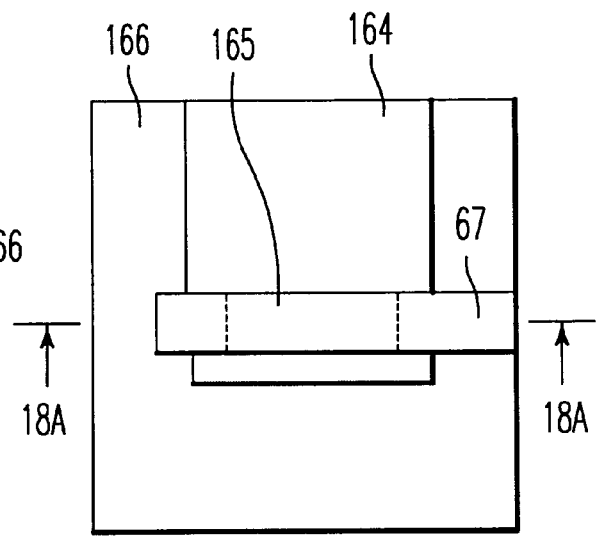

FIG. 18A is a cross-sectional view along a line 18A—18A of a plan view of FIG. 18B for explaining a manufacturing step following FIGS. 17A and 17B. The first linear resist pattern 167 is formed to extend longer than a length of the intended junction region 165. Further, a width of the first linear pattern 167 defines a minimum dimension of shorter axis of the TMR junction. When the width is about 0.1 µm, the width can be controlled by photolithography. When the width is less than 0.1 µm, it is preferable to use EB lithography.

Figure 19A:
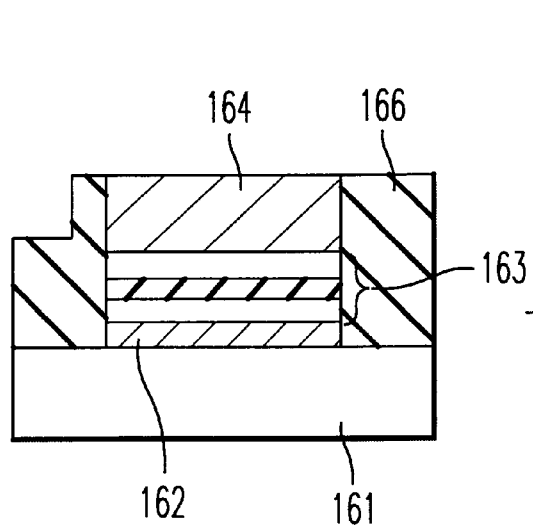
FIGS. 19A and 19B are a cross-sectional view and a plan view for explaining a manufacturing step after the steps in FIGS. 18A and 18B.
Figure 19B:
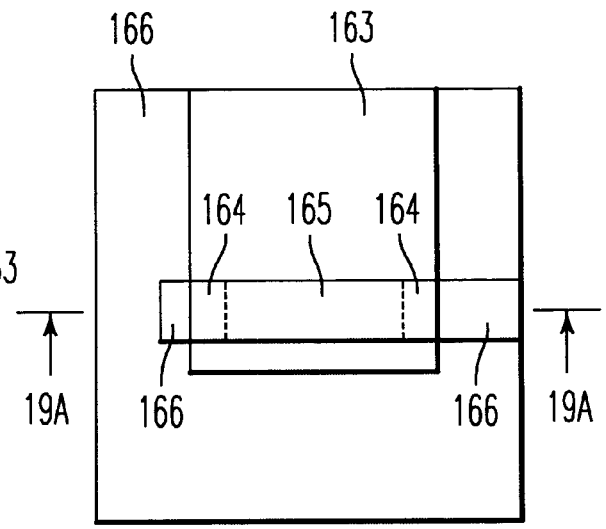

FIG. 19A is a cross-sectional view along a line 19A—19A of a plan view of FIG. 19B for explaining a manufacturing step following FIGS. 18A and 18B. The linear resist pattern 167 is transcribed to the contact layer 164 using RIE, and thereafter the resist 167 is removed. A reactive gas of F species, for example $SF_6$, can be used during the RIE and the linear pattern of the resist 167 can be accurately transcribed to the contact layer 164 of Ta and adjacent portion of $SiO_x$ layer 166. The magnetic metal layer of the MTJ film 163 is provided with a resistance against dry etching of the F species gas, whereby only the contact layer 164 of Ta is formed into the linear pattern.

FIG. 20A is a cross-sectional view along a line 20A—20A of a plan view of FIG. 20B for explaining a manufacturing step following FIGS. 19A and 19B. The matrix of the MTJ film 163 is subjected to ion milling with the contact layer 164 of Ta as a mask, where Ta is provided with a sufficient resistance as a hard mask against ion milling. Therefore, even when Ar ion milling having a beam energy of 400 (eV) is performed to expose the wiring layer 162 of Ta, a recess of the Ta mask layer 164 and reduction of the film thickness of layer 161 are inconsiderable and the fine linear pattern of the contact layer 164 of Ta can be transcribed to the MTJ film 163. Reactive dry etching using a mixture gas of $Cl_2$ and Ar can also be used to make the pattern of the MTJ film 163 in place of the ion milling. Materials excellent in Cl species etching resistance, such as Diamond Like Carbon (DLC), $AlO_x$, $SiO_2$, a multi-layered resist mask or their equivalents can also be used as the mask layer. The insulating film 166 etched simultaneously can be a material which has reduced etching resistance against Cl species, such as TEOS. It is preferable to previously form a mask layer on the contact layer 164.

FIG. 21A is a cross-sectional view along a line 21A—21A of a plan view of FIG. 21B for explaining a manufacturing step following FIGS. 20A and 20B. The nonmagnetic dielectric layer 166' of $SiO_x$ is formed so as to surround the contact layer 164 on the MTJ film 163 and the surfaces of the nonmagnetic dielectric layer 166' and the contact layer 164 are flattened. A wide pattern indicated by broken lines of FIG. 21B corresponds to the embedded wiring layer 162.

Figure 22A:
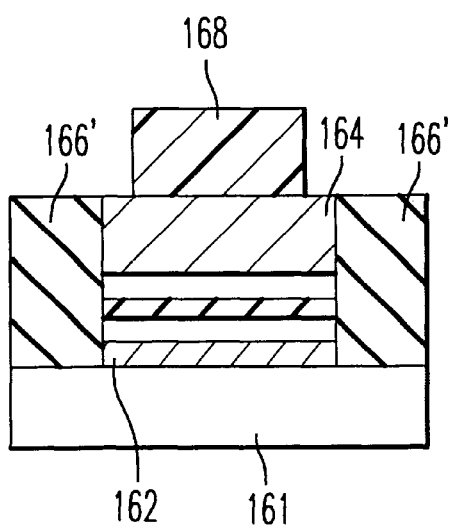
FIGS. 22A and 22B are a cross-sectional view and a plan view for explaining a manufacturing step after the steps in FIGS. 21A and 21B.
Figure 22B:
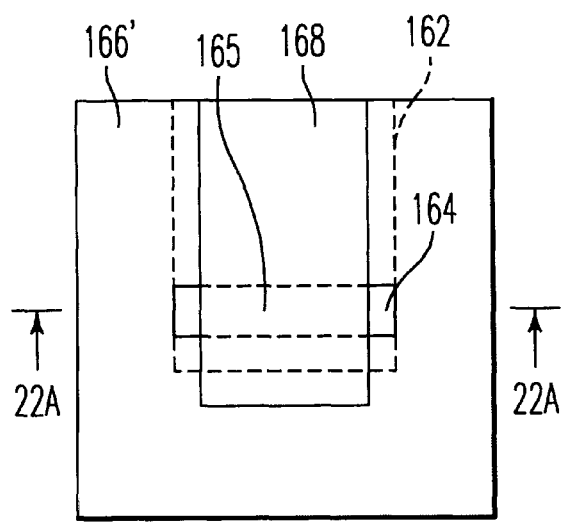

FIG. 22A is a cross-sectional view along a line 22A—22A of a plan view of FIG. 22B for explaining a manufacturing step following FIGS. 21A and 21B. A resist 168 of FIGS. 22A and 22B for prescribing the two other remaining sides of the TMR junction 165 and having a second linear pattern sufficiently longer than the intended junction pattern is formed by photolithography.

Figure 23A:
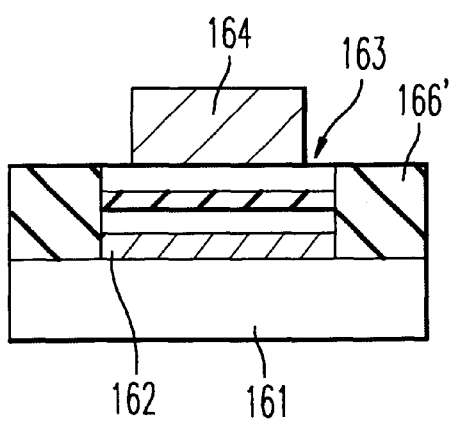
FIGS. 23A and 23B are a cross-sectional view and a plan view for explaining a manufacturing step after the steps in FIGS. 22A and 22B.
Figure 23B:
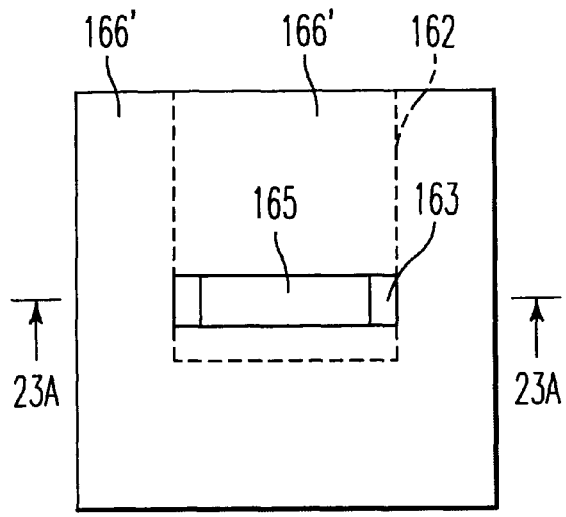

FIG. 23A is a cross-sectional view along the line 23A—23A of a plan view of FIG. 23B for explaining a manufacturing step following FIGS. 22A and 22B. The second linear pattern by the resist 168 is transcribed to the contact layer 164 of Ta by dry etching using a reactive gas of F species and then the resist 168 is removed, whereby the contact layer 164 aligned to the intended pattern 165 is formed.

FIG. 24A is a cross-sectional view along the line 24A—24A of a plan view of FIG. 24B. The MTJ film 163 and the wiring layer 162 of Ta are etched using the contact layer 164 as a hard mask by ion milling. The MTJ film 163 is formed to have a final shape of predetermined pattern 165, whereby the rectangular shape of the ferromagnetic tunnel junction is formed while maintaining the sharpness of the corners.

The contact layer 164 of the embodiment is used as a mask and therefore it has the same shape as the MTJ film. However, the contact layer 164 does not necessarily have the same plane shape and can have a larger or smaller plane shape than the predetermined shape 165 formed by successive process.

The second linear pattern of resist 168 can be alternatively formed to be inclined from the orthogonal relation with the resist 168 to the first linear pattern of the MTJ film 163 of FIG. 22B, whereby a MTJ of a parallelogram of a low coercive force characteristic is formed.

FIG. 25A is a cross-sectional view along a line 25A–25B of a plan view of FIG. 25A. The $SiO_x$ insulating film 166' is formed to surround the side surfaces of the MTJ film 163 and the contact layer 164 and its surface is flattened with the surface of the contact layer 164 of FIGS. 25A and 25B.

FIG. 26A is a cross-sectional view along a line 26A—26A of a plan view of FIG. 26B. A wiring layer 169 having a multi-layered film, including Ti layer, TiN layer, AlCu layer and Ti layer, is formed on the flattened surface of the contact layer 164 and the $SiO_x$ insulating film 166' and is patterned by photolithography and dry etching, thereby the wiring layer 169 coupled to the TMR device 163 is formed and the TMR device with an peripheral circuit (not shown) is electrically connected.

The wiring layer 169 can be alternatively formed over the contact layer 164 and $SiO_x$ insulating film 166' following the step of FIGS. 21A and 21B. Also, the second linear mask pattern 168 can be formed to make a pattern of the wiring layer 169 as well as the ferromagnetic tunnel junction 165. This process step configuration has an advantage of dispensing with the independent lithography process for forming the wiring layer 169.

FIGS. 27A–38B are views for explaining a manufacturing method of a magnetoresistance effect device according to a tenth embodiment of the present invention.

Figure 28A:
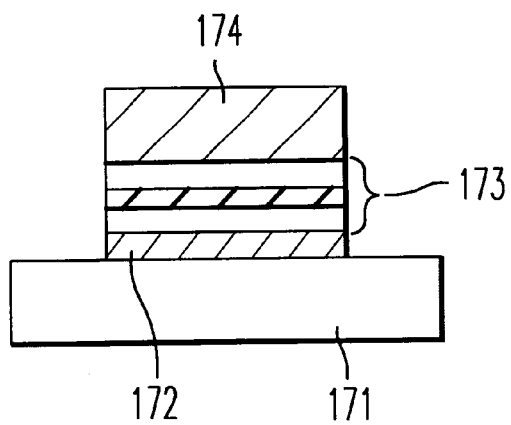
FIGS. 28A and 28B are a cross-sectional view and a plan view for explaining a manufacturing step after the steps in FIGS. 27A and 27B.
Figure 28B:
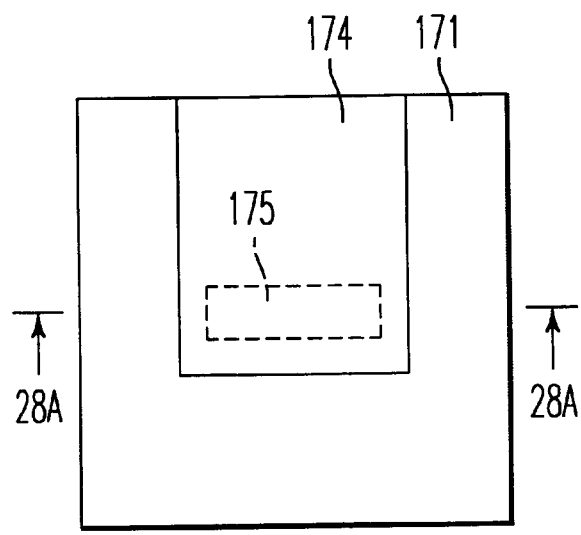
Figure 29A:
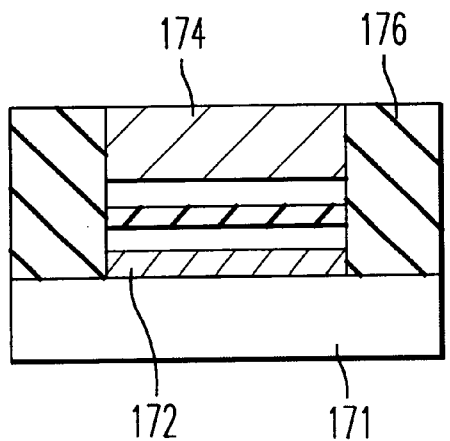
FIGS. 29A and 29B are a cross-sectional view and a plan view for explaining a manufacturing step after the steps in FIGS. 28A and 28B.
Figure 29B:
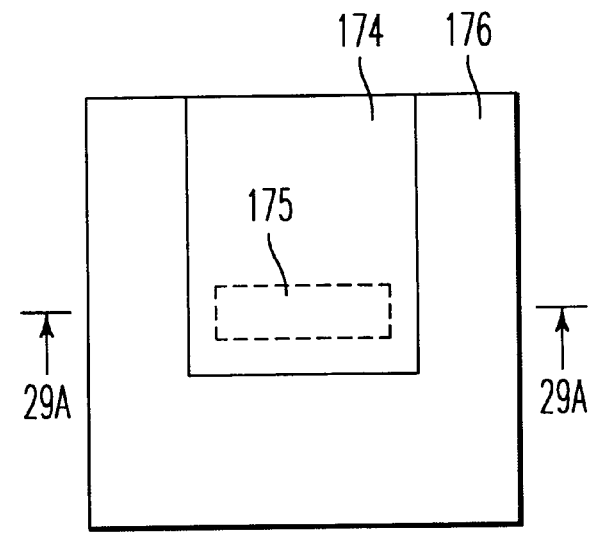

Manufacturing steps relating to FIGS. 27A, 27B, 28A, 28B, 29A and 29B can be processed in similar way to the above-described steps of FIGS. 15A, 15B, 16A, 16B, 17A and 17B. Therefore, a duplicate explanation thereof is omitted. FIG. 27A is a cross-sectional view along a line 27A—27A of a plan view of FIG. 27B, FIG. 28A is a cross-sectional view along a line 28A—28A of a plan view of FIG. 28B, and FIG. 29A is a cross-sectional view of a line 29A—29A of a plan view of FIG. 29B. Numeral 171 corresponds to the Si substrate 161, numeral 172 corresponds to the wiring layer 162 of Ta, numeral 173 corresponds to the magnetic tunnel junction (MTJ) layer 163, numeral 174 corresponds to the contact layer 164 of Ta, and numeral 175 corresponds to a predetermined region for the TMR device including predetermined intended region 165 of MTJ.

Figure 30A:
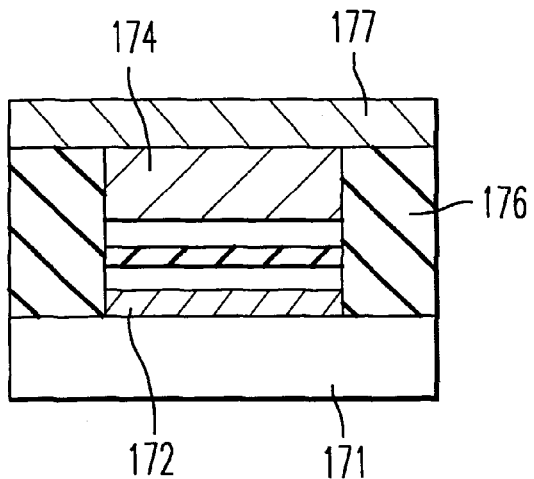
FIGS. 30A and 30B are a cross-sectional view and a plan view for explaining a manufacturing step after the steps in FIGS. 29A and 29B.
Figure 30B:
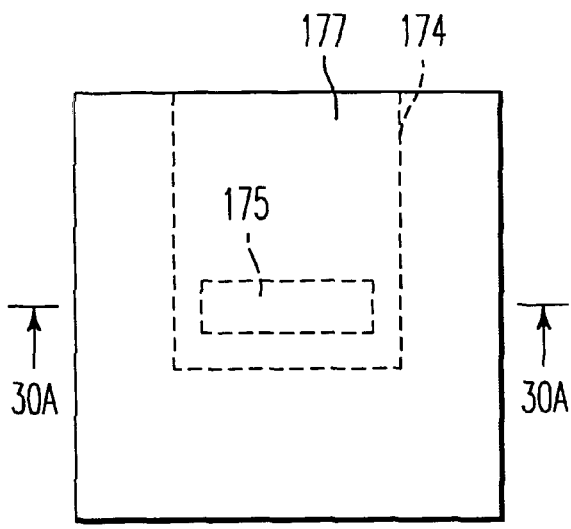

FIG. 30A is a cross-sectional view along a line 30A—30A of a plan view of FIG. 30B. A layer 177 of Cr is formed over the surfaces of the contact layer 174 and the $SiO_x$ insulating film 176. A wide pattern indicated by broken-lines in FIG. 30B corresponds the pattern of the contact layer 174.

Figure 31A:
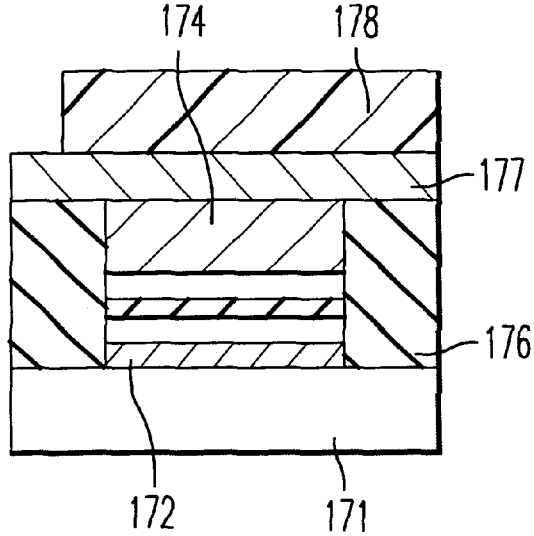
FIGS. 31A and 31B are a cross-sectional view and a plan view for explaining a manufacturing step after the steps in FIGS. 30A and 30B.
Figure 31B:
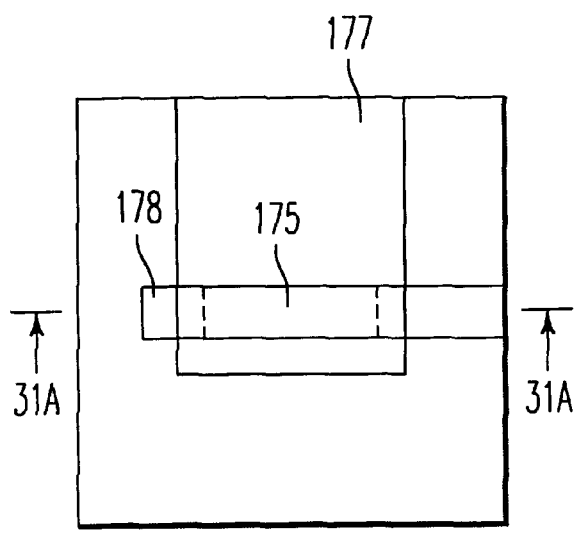

FIG. 31A is a cross-sectional view along a line 31A—31A of a plan view of FIG. 31B. A resist 178 for a first linear pattern is formed by photolithography. The first linear pattern by the resist 178 is transcribed to Cr mask layer 177 using dry etching in a presence of a mixture gas of $Cl_2$ and $O_2$.

FIG. 32A is a cross-sectional view along a line 32A—32A of a plan view of FIG. 32B. The resist 178 is removed and the mask layer 177 of Cr is remained. The mask layer 177 is thin enough so the dry etching for making pattern of the Cr mask layer 177 does not substantially affect a surface flatness of the layer 174 of Ta and the $SiO_x$ insulating film 176.

FIG. 33A is a cross-sectional view along a line 33A—33A of a plan view of FIG. 33B. A resist 179 for a second linear pattern is formed by photolithography to be orthogonal to the first linear pattern transcribed to the Cr mask layer 177.

FIG. 34A is a cross-sectional view along a line 34A—34A of a plan view of FIG. 34B. The resist pattern 179 is transcribed to a pattern of the Cr mask layer 177 using dry etching in a presence of a mixture gas of $Cl_2$ and $O_2$. The Cr mask layer 177 is patterned to have sharp corners and to correspond to a final shape of the ferromagnetic tunnel junction 175. Because of the dry etching selective ratio of the Cr mask layer 177 and the Ta contact layer 174 is large enough that the film thickness of the Cr mask layer 177 can be about 20 nm, whereby no dent of substantial depth is formed on the surface of the $SiO_x$ insulating film 176.

FIG. 35A is a cross-sectional view along a line 35A—35A of a plan view of FIG. 35B. Using the rectangular mask pattern of the Cr mask layer 177 by dry etching in a presence of $SF_6$ forms the contact layer 174 of Ta.

FIG. 36A is a cross-sectional view along a line 36A—36A of a plan view of FIG. 36B. The MTJ film 173 is etched and the wiring layer 172 of Ta is exposed to Ar ion milling using the Ta contact layer 174 as a mask. The pattern of the MTJ film 173 can also be formed by a reactive dry etching in a presence of a mixture gas of $Cl_2$ and Ar in place of Ar ion milling.

FIG. 37A is a cross-sectional view along the line 37A—37A of a plan view of FIG. 37B. An $SiO_x$ nonmagnetic dielectric layer 176' is formed around the side surface of the MTJ film 173 and the contact layer 174, and the surfaces of the $SiO_x$ nonmagnetic dielectric layer 176' and the contact layer 174 are flattened by CMP.

FIG. 38A is a cross-sectional view along a line 38A—38A of a plan view of FIG. 38B. A wiring layer 180 is formed using a known method and the TMR device is coupled to a peripheral circuit (not shown) via the wiring layer 180. Several successive steps known in the art may be employed after the above-described steps to complete the manufacturing of the magnetic memory apparatus.

As the mask layer for forming the pattern of MTJ film, DLC or a nonphotosensitive organic material, such as polyimide or its equivalents, can be used. When these materials are used as the mask layer, dry etching using an $O_2$ gas as a reactant, can be employed, whereby the etching selective ratio of the mask layer to the metal contact layer 174 becomes large enough so a deterioration of the metal contact layer 174 can be eliminated. In that case, an $O_2$ plasma resistant process on a resist surface, such as silylation, or multi-layered resist in photolithography is preferably used. Because DLC or a nonphotosensitive organic material is amorphous, a very smooth sidewall is provided even when forming a very small pattern of 0.1 µm orders.

A pattern of MTJ film of a lower coercive force characteristic can be formed by repeating a linear pattern formation and dry etching three times.

As is known from the diagram of FIG. 6, the shape (b), in which the diagonal corners are cut, can also attain a comparatively low coercive force characteristic. The shape (b) of FIG. 6 can be provided as a ferromagnetic tunnel junction 181 of a hatched portion by repeating a formation of linear patterns 182, 183 and 184 of a plan view in FIG. 39, and dry etching each time. By repeating the linear pattern formation and etching a plurality of times, a junction pattern of a convex polygonal shape can be accurately formed.

It is clear that such a process of linear pattern formation and dry etching a plurality of times, is applicable to both of the method of etching up to the ferromagnetic tunnel junction by the linear patterns as in the ninth embodiment and the method of etching only the mask layer by the linear pattern as in the tenth embodiment.

When the above-described method for forming the multiple linear patterns is used in forming a plurality of TMR devices aligned in cross points of lattice in an integrated memory apparatus, lithography is efficient.

Figure 40:
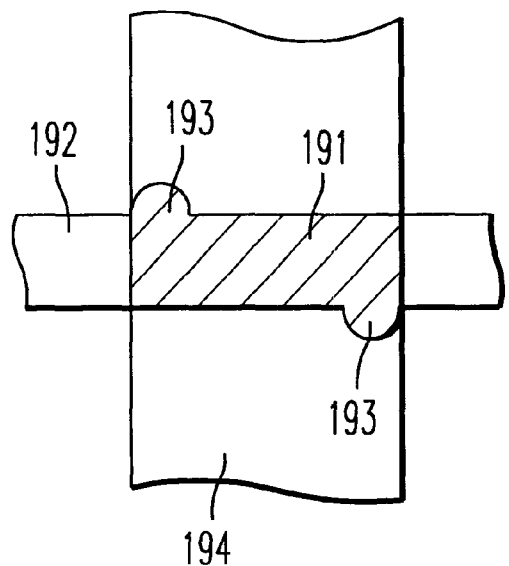
FIG. 40 is a plan view for explaining a method of fabricating a magnetoresistance effect device according to a twelfth embodiment of the present invention.

FIG. 40 is a plan view for explaining a manufacturing process of the TMR device of FIG. 7B according to a twelfth embodiment of the present invention. A first linear pattern 192 is first formed by photolithography, and patterns 193 of a semicircular shape are added to be aligned at diagonal corners of a rectangle by spot EB drawing. A chemically sensitized resist for EB and/or far ultraviolet beam, such as SAL 601, can be used as a resist. The linear pattern with the projections 193 in a semispherical shape can also be formed by a method of mix and match for performing photolithography and EB lithography with an overlap.

Generally, EB lithography is a process having a low process throughput, but only the pattern having a diameter of 50 nm can be drawn at a very high speed by the spot drawing. For example, when the spot drawing is performed by a beam current of 100 pA using the chemically sensitized SAL601 resist, about $10^9$ pieces of spots in correspondence with a memory capacity of 1 Gbit can be drawn only in several minutes. Therefore, MRAM in correspondence with 1 Gbit can be fabricated with high productivity by combining a linear pattern exposure having a width of about 0.1 µm by photolithography and spot exposure having a diameter of about 50 nm by EB lithography.

The above-described ferromagnetic tunnel junction is applicable to a magnetic recording apparatus, a magnetoresistance effect head, a magnetic reproducing apparatus or their equivalents.

Figure 41:
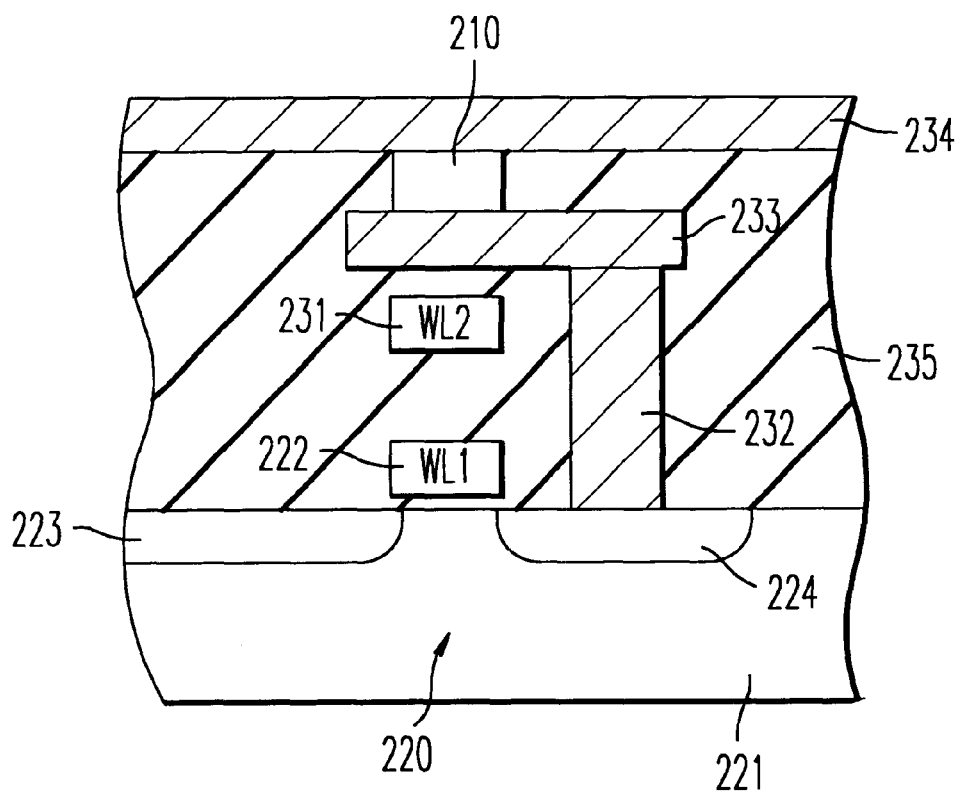
FIG. 41 is a cross-sectional view showing a structure of one cell of MRAM according to a thirteenth embodiment of the present invention.

FIG. 41 is a cross-sectional view of a part of a magnetic memory apparatus according to a thirteenth embodiment.

As shown, the MOSFET 220 includes a gate electrode 222 and source and drain regions 223 and 224. The gate electrode 222 is formed on the semiconductor substrate 221 via a gate insulator layer and the source and drain regions 223 and 224 is formed in the surface of the semiconductor substrate 221. The gate electrode 222 extends in a direction orthogonal to a paper surface of FIG. 41 and forms a word line WL1. A wiring 233 is coupled with one of the source drain regions 224 via a contact 232 and is connected to a magnetoresistance effect device 210 of any of the above-described embodiments of the present invention. The magnetoresistance effect devices 210 are coupled with the wiring 233 and a bit line 234. A write line WL2 is formed near the magnetoresistance effect device 210 and the write line WL2 is used for writing and inverting magnetization of ferromagnetic material layer of the magnetoresistance effect device 210 by a current flow, as the magnetization is magnetic information.

Memory apparatus, such as MRAM, are generally expected to have a large capacity. Therefore, not only a wiring width but also an area of each cell is obliged to be reduced. The switching electric field can be reduced by using the magnetoresistance effect device according to the present invention and write current necessary for writing a magnetization invert may be reduced, whereby power consumption being restrained and switching being carried out at high speed.

Figure 42:
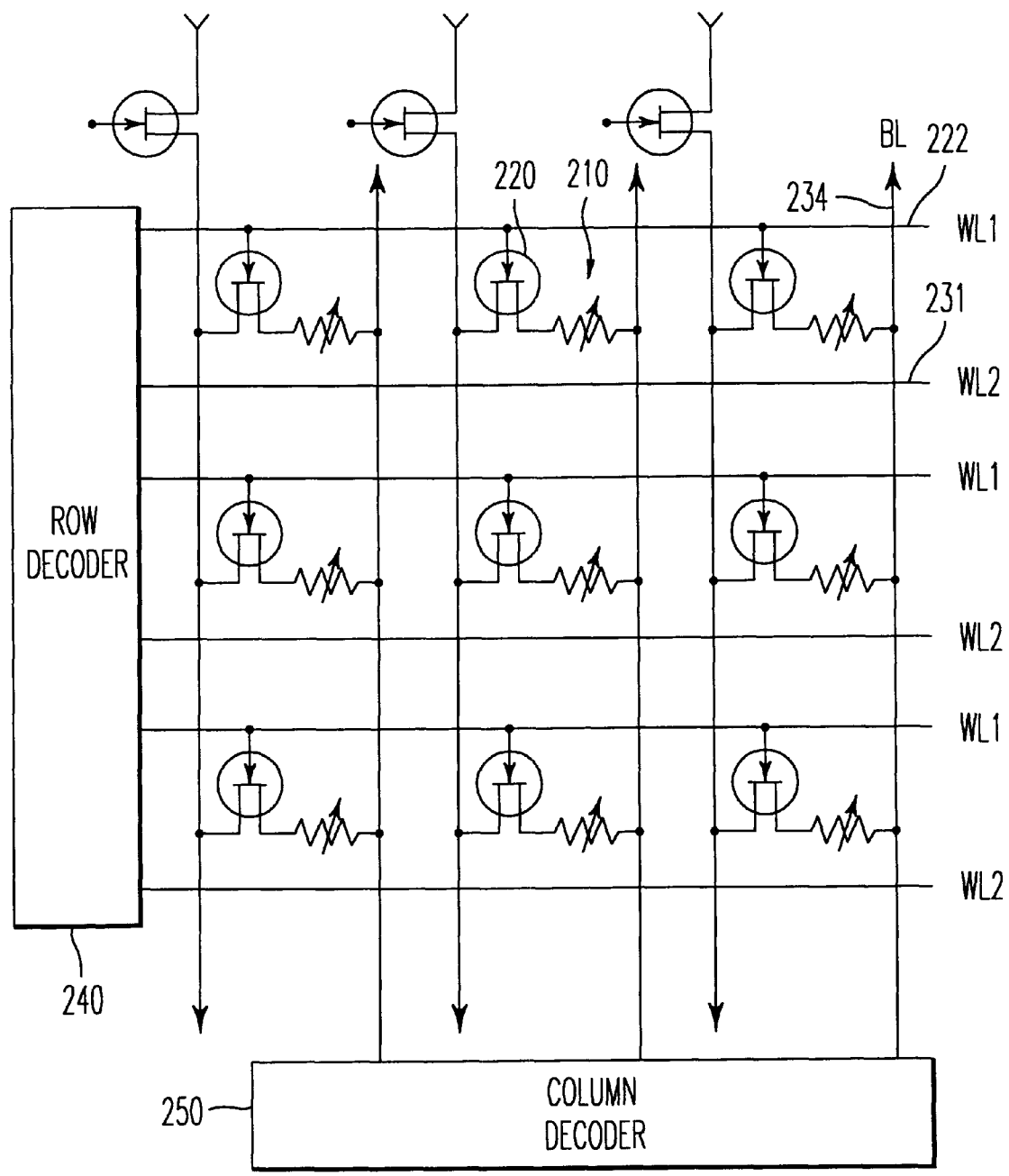
FIG. 42 is a circuit diagram of a MRAM according to the thirteenth embodiment of the present invention.

FIG. 42 is a diagram of a part of magnetic random access memory apparatus including the TMR device 210. The memory apparatus includes a plurality of word lines WL1 222, for selecting a memory cell to read magnetic information of the selected memory cell, coupled to a row decoder 240 and a plurality of bit lines BL 234 coupled to a column decoder 250. Each bit line BL 234 is intersected with each word line WL1 222 and a plurality of the TMR devices 210 according the embodiments are formed at each of the intersections.

The MOSFET 220 for selecting a memory cell including the TMR device is formed to couple the TMR device 210 of each memory cell and its gate electrode is WL1 222, whereby the TMR device 210 of the memory cell can be selected by controlling the word line WL1 222. Each of the plural word lines WL2 231, for writing the magnetic information by inverting or changing the magnetization of the ferromagnetic material layer, extends in a direction in parallel with the word line WL1 222 and is near a magnetoresistance device 210.

Each of a plurality of diodes formed in place of the MOSFET 220 can alternatively be used as switching transistor. Each of the diodes may be formed on the word line WL1 222 at the intersection, the bit line BL 234 may be formed on the TMR device 210 at the intersection, and the plurality of the memory cells are arranged in an array to form the MRAM. The MRAM can be mounted to a memory region of a mode terminal of portable telephone, personal digital assistant.

A fourteenth embodiment is an embodiment in which the magnetoresistance effect device of the present invention is applied to a magnetic head.

Figure 43:
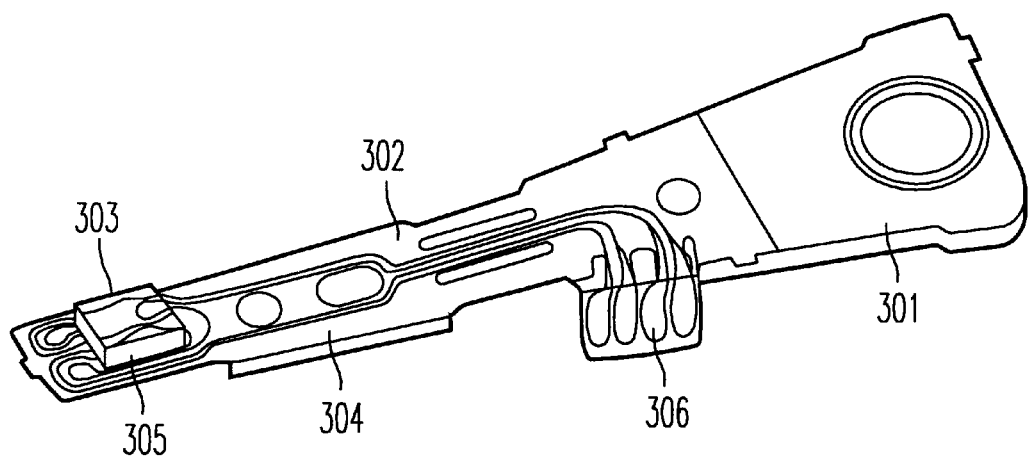
FIG. 43 is an overview of a magnetoresistance effect head according to a fourteenth embodiment of the present invention.

FIG. 43 is an overview of a magnetoresistance head assembly mounted with the MR device according to the first through the seventh embodiments of the present invention. An actuator arm 301 is provided with a hole for being fixed to a fixed shaft inside of a magnetic disk apparatus and is provided with a bobbin portion for holding a drive coil (not illustrated) and the like. A suspension 302 is fixed to one end of the actuator 301. A front end of the suspension 302 is wired with a lead wire 304 for writing and reading signals, one end of the lead wire 304 is coupled with respective electrode of a magnetoresistance effect device 305 mounted on a head slider 303, and the other end of the lead wire 304 is connected to an electrode pad 306.

Figure 44:
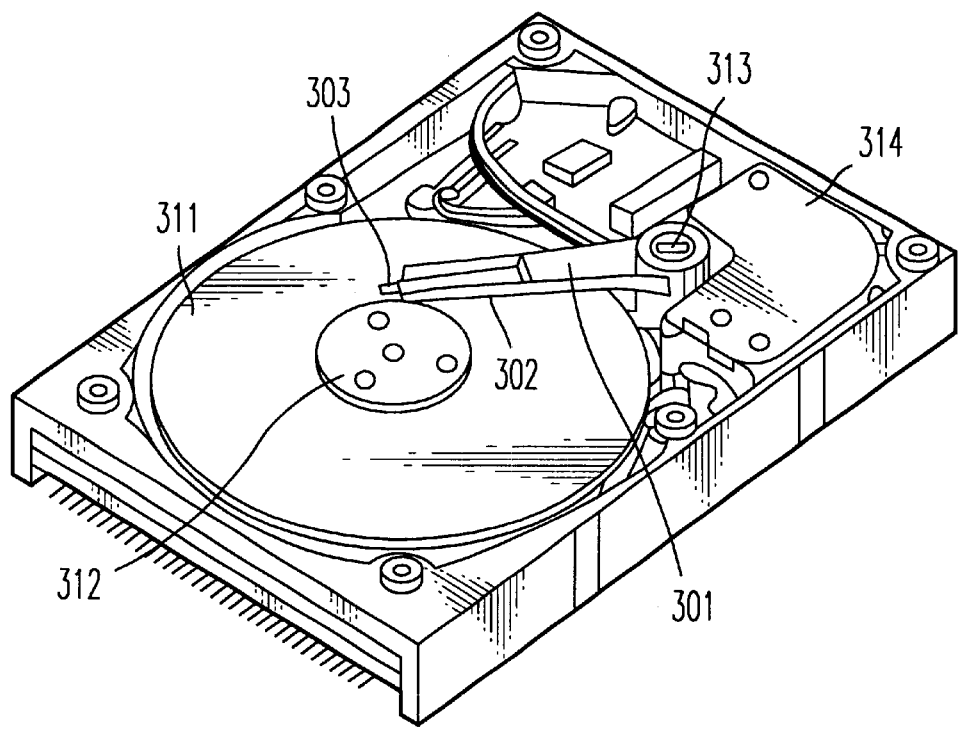
FIG. 44 is an overview of a magnetic reproducing apparatus using a magnetoresistance effect head according to a fifteenth embodiment of the present invention.

FIG. 44 is an overview of an inner structure of a magnetic disk apparatus (magnetic information reproducing apparatus) mounted with the magnetic head assembly of FIG. 43. A magnetic disk 311 is mounted on a spindle 312 and is rotated by a motor (not illustrated) responding to a control signal from a control portion of a drive apparatus (not illustrated).

The actuator arm 301 is fixed to a fixed shaft 313 for supporting the suspension 302 and the head slider 303 at the front end thereof. When the magnetic disk 311 is rotated, a surface of the head slider 303 opposed to the disk 311 is held in a floating state from a surface of the magnetic disk 311 by a predetermined amount, thereby reproducing the magnetic information of the magnetic disk. At another end of the actuator arm 301, a voice coil motor 314 is provided and includes a type of a linear motor. The voice coil motor 314 includes a drive coil (not illustrated) wound up to the bobbin portion of the actuator arm 301 and a magnetic circuit including a permanent magnet and an opposed yoke arranged to be opposed to each other to interpose the coil.

The actuator arm 301 is supported by ball bearings (not illustrated) provided at two upper and lower locations of the fixed shaft 313 and can freely be slidingly rotated by the voice coil motor 314.

According to the magnetic head or the magnetic reproducing apparatus using the MR device of the embodiments of the present invention, operation at a speed faster than the conventional apparatus and a more stabilized and large capacity formation can be attained.

According to the magnetoresistance effect device of the present invention, the coercive force is small and the switching magnetic field is small. When the device is used as a memory cell of a magnetic memory, the current of a write wiring for generating a magnetic field necessary for inverting magnetization can be reduced. Therefore, according to the magnetic memory forming the memory cell by the magnetoresistance effect device of the present invention, a highly integrated formation can be performed, the power consumption is reduced, and the switching speed can be made faster.

Further, according to the method of fabricating the magnetoresistance effect device of the present invention, an easy process with excellent yield can be used to fabricate the above-described device.

Although the present invention has been particularly shown and described with reference to an embodiment thereof, it will be understood those skilled in the art that various other changes in the form and details may be made therein without departing from the spirit and scope of the present invention.

What is claimed is:

1. A magnetoresistance effect device, comprising:
a first ferromagnetic layer;
a first nonmagnetic dielectric layer formed on the first ferromagnetic layer; and
a second ferromagnetic layer formed on the first nonmagnetic dielectric layer,
wherein one of the first and second ferromagnetic layers comprises a plane shape in which a center region is disposed between first and second end regions, and the center region has a width narrower than each width of the first and second end regions.

2. The magnetoresistance effect device according to claim 1, wherein the first nonmagnetic dielectric layer and the other of the first and second ferromagnetic layers has a plane shape aligned to the plane shape of the one of the first and second ferromagnetic layers.

3. The magnetoresistance effect device according to claim 1, wherein at least one of the first and the second ferromagnetic layers comprises a laminate film including a pair of ferromagnetic layers, and a nonmagnetic layer formed between the pair of ferromagnetic material layers.

4. The magnetoresistance effect device according to claim 1, further comprising:
a second nonmagnetic dielectric layer formed on the second ferromagnetic layer; and
a third ferromagnetic layer formed on the second nonmagnetic dielectric layer.

5. The magnetoresistance effect device according to claim 1, wherein the first and second end regions respectively comprise a base region and a extended region, the center region and two base regions of the first and second end regions substantially form a rectangular, and the two extended regions are added to the rectangular to be substantially aligned diagonally to each other.

6. The magnetoresistance effect device according to claim 5, wherein the rectangle has a shorter axis and a longer axis, the center region and two base regions are aligned to be substantially parallel to the longer axis, and each of the two extended regions are extended from the base region in a direction orthogonal to the longer axis.

7. The magnetoresistance effect device according to claim 5, wherein the plane shape comprises an S-shape.

8. The magnetoresistance effect device according to claim 5, wherein each of the two extended region has a substantially semicircular-plane shape.

9. The magnetoresistance effect device according to claim 1, wherein said one of the first and second ferromagnetic layers comprises a magnetization free layer in which a magnetization is free to rotate in an applied magnetic field.

10. The magnetoresistance effect device according to claim 9, wherein the other of the first and second ferromagnetic layers comprises a magnetization pinned layer in which a magnetization is fixed in the applied magnetic field.

11. The magnetoresistance effect device according to claim 1, wherein the plane shape is substantially rotationally symmetrical with a center of the plane as a pivot.

12. The magnetoresistance effect device according to claim 11, wherein said one of the first and second ferromagnetic layers has an easy magnetization axis and the plane shape is not substantially symmetrical with the easy magnetization axis.

13. The magnetoresistance effect device according to claim 1, wherein the widths of the first and second end regions are different from each other.

14. A magnetic random access memory, comprising a plurality of the magnetoresistance effect devices of claim 1.

15. A personal digital assistance, comprising a plurality of the magnetoresistance effect devices of claim 1.

16. A magnetic reproducing head, comprising the magnetoresistance effect device of claim 1.

17. A magnetic information reproducing apparatus, comprising the magnetoresistance effect device of claim 1.

* * * * *